United States Patent
Okamura

[11] Patent Number: 6,135,053
[45] Date of Patent: Oct. 24, 2000

[54] APPARATUS FOR FORMING A DEPOSITED FILM BY PLASMA CHEMICAL VAPOR DEPOSITION

[75] Inventor: Ryuji Okamura, Souraku-gun, Japan

[73] Assignee: Canon Kabushiki Kaisha, Tokyo, Japan

[21] Appl. No.: 09/116,369

[22] Filed: Jul. 16, 1998

[30] Foreign Application Priority Data

Jul. 16, 1997 [JP] Japan ................................ 9-205507

[51] Int. Cl.[7] .................................................. C23C 16/00
[52] U.S. Cl. .................................... 118/723 E; 118/723
[58] Field of Search .......................... 118/723 E, 723 R, 118/730, 724, 723 ER, 723 IR, 723 AN, 723 ME; 156/345

[56] References Cited

U.S. PATENT DOCUMENTS

| | | | |
|---|---|---|---|
| 4,265,991 | 5/1981 | Hirai et al. ................................. | 430/64 |
| 4,788,120 | 11/1988 | Shirai et al. .............................. | 430/66 |
| 4,909,183 | 3/1990 | Kamiya et al. ...................... | 118/723 E |
| 5,637,180 | 6/1997 | Gosain et al. .......................... | 156/345 |

FOREIGN PATENT DOCUMENTS

| | | |
|---|---|---|
| 60-168156 | 8/1985 | Japan . |
| 60-178457 | 9/1985 | Japan . |
| 60-225854 | 11/1985 | Japan . |
| 61-231561 | 10/1986 | Japan . |
| 4-183871 | 6/1992 | Japan . |

*Primary Examiner*—Shrive Beck
*Assistant Examiner*—Parviz Hassanzadeh
*Attorney, Agent, or Firm*—Fitzpatrick, Cella, Harper & Scinto

[57] ABSTRACT

A film-forming method and apparatus by high frequency plasma CVD, characterized by using a specific high frequency power introduction means comprising at least an electrode for introducing a high frequency power into a deposition chamber containing a substrate therein and an insulating member which covers said electrode such that the surface of said electrode is isolated from glow discharge caused in said deposition chamber, said electrode being provided with a plurality of gas ejection holes for ejecting gas against an inner face of said insulating member, wherein the formation of a deposited film on the substrate in the deposition chamber is conducted while ejecting gas (inert gas or hydrogen gas) from the gas ejection holes of the electrode against the inner face of the insulating member.

28 Claims, 8 Drawing Sheets

F I G. 3
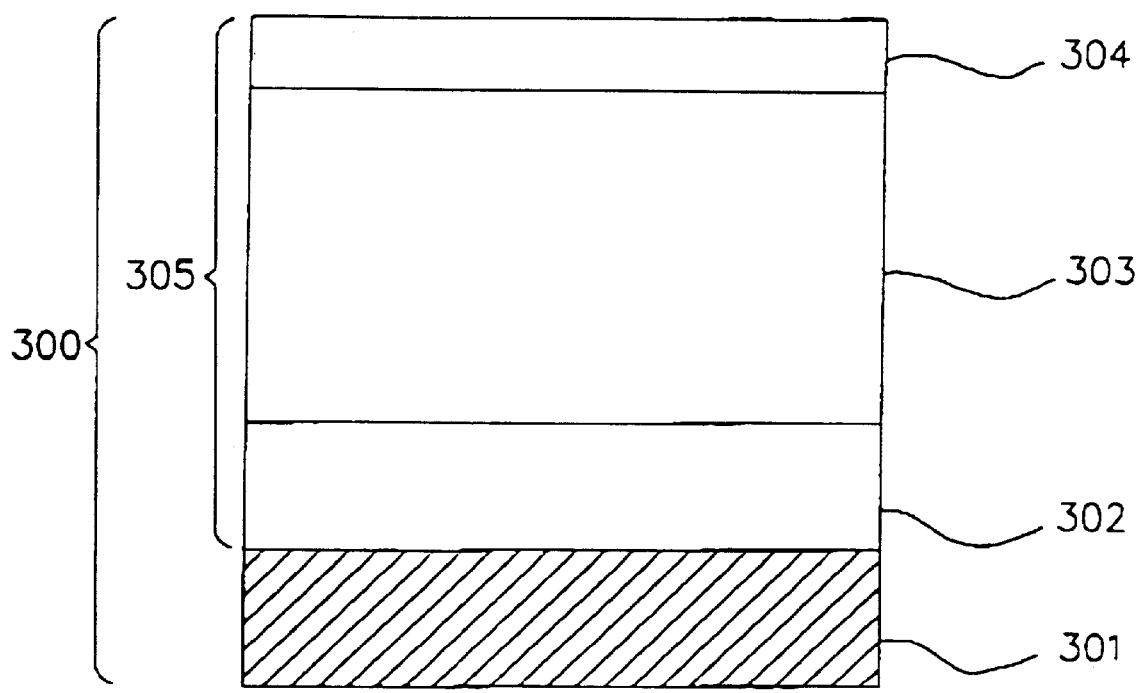

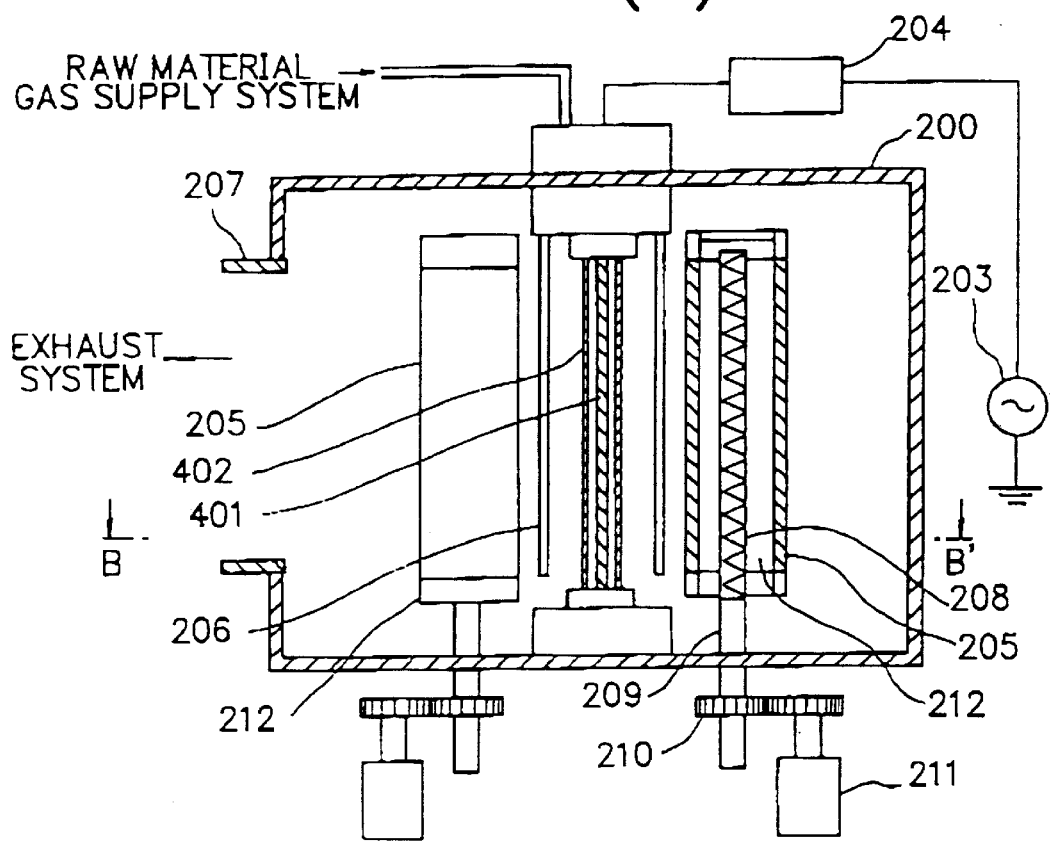
F I G. 4(A)
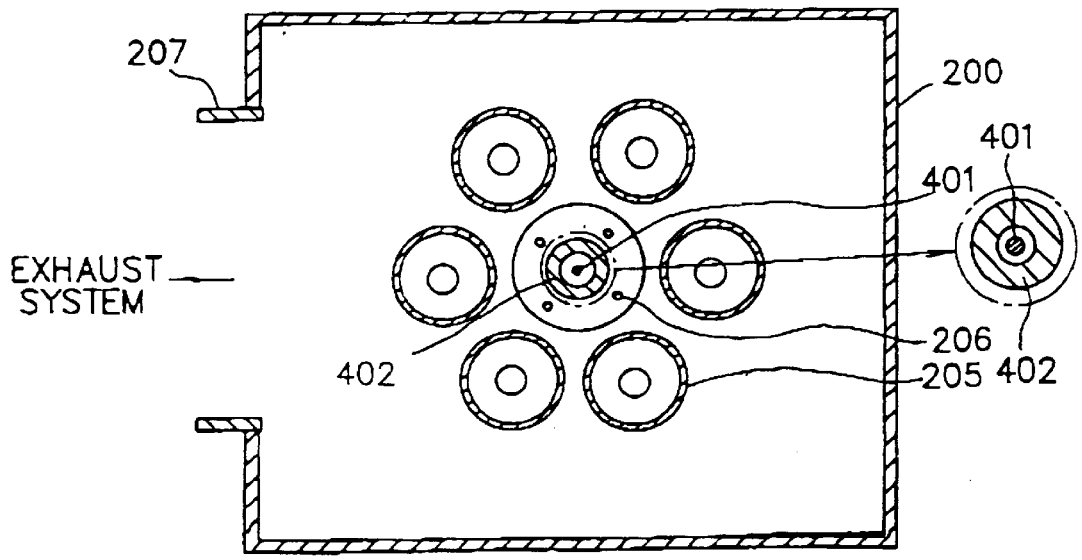
F I G. 4(B)

RESVLTS OF
EXPERIMENT 1

SURFACE OF
ELECTRODE COVER

SURFACE TEMPERATURE (°C)
- 300~400
- 400~500
- 500~600
- 600~700
- 700~800

RESVLTS OF COMPARATIVE
EXPERIMENT 1

SURFACE OF
ELECTRODE COVER

SURFACE TEMPERATURE (°C)
- 300~400
- 400~500
- 500~600
- 600~700
- 700~800

RESULTS OF
EXPERIMENT 2

SURFACE OF
ELECTRODE COVER

SURFACE TEMPERATURE (°C)

APPARATUS FOR FORMING A DEPOSITED FILM BY PLASMA CHEMICAL VAPOR DEPOSITION

BACKGROUND OF THE INVENTION

1. Field of the Invention

The present invention relates to a method and apparatus for forming a deposited film on a substrate by plasma chemical vapor deposition (hereinafter referred to simply as "plasma CVD"). More particularly, the present invention relates to a method and apparatus for forming a functional deposited film such as a semiconductor film on a substrate by plasma CVD, said deposited film being capable of use in the production of semiconductor devices, electrophotographic light receiving members (or electrophotographic photosensitive devices), image input line sensors, image pickup devices, photovoltaic devices (including solar cells), and the like.

2. Related Background Art

In the image-forming industrial field, for the photoconductive material to constitute a light receiving layer in an electrophotographic light receiving member, it is required to be highly sensitive, and have a high S/N ratio [photo-current (Ip)/dark current (Id)], absorption spectrum characteristics suited for an electromagnetic wave to be irradiated, quick photoresponsibility, and a desired dark resistance. It is also required not to be harmful to living things, especially the human body, upon use.

Particularly, for the electrophotographic light receiving member (hereinafter occasionally referred to as "light receiving member" for simplification purpose) used in an electrophotographic apparatus which is used as a business machine at the office, not causing pollution is highly important.

As an electrophotographic light receiving member, there can be mentioned electrophotographic light receiving members comprising a non-single crystalline silicon material such as an amorphous silicon (a-Si) material (the electrophotographic light receiving member comprising an amorphous silicon (a-Si) material will be hereinafter referred to as a-Si series electrophotographic light receiving member). For example, U.S. Pat. No. 4,265,991 discloses electrophotographic light receiving members having a photoconductive layer constituted by an a-Si material and which excels in moisture resistance, durability and electric and photoconductive characteristics.

A U.S. Pat. No. 4,788,120 discloses electrophotographic light receiving members having a surface layer constituted by an amorphous material containing silicon atoms (Si), carbon atoms (C), and hydrogen atoms (H) in an amount of 41 to 70 atomic %.

Based on these techniques, there have been realized desirable a-Si series electrophotographic light receiving members comprising an a-Si material, which are satisfactory in electric, optical and photoconductive characteristics, use-environmental characteristics and durability, and which provide a high quality reproduced image.

To effectively produce an electrophotographic light receiving member, an advanced technique is required. Particularly, in the case of an a-Si series electrophotographic light receiving member, it is necessary to have a greater area and thickness in comparison with other devices. As a result an a-Si deposited film formed as the light receiving layer must be uniform. It is also important to prevent abnormal film growth due to formation of a nucleus comprising foreign matter during the formation of the a-Si deposited film.

In view of this, there are various proposals for stably and efficiently producing a high quality a-Si series electrophotographic light receiving member on an industrial scale.

In the production of an a-Si series electrophotographic light receiving member, spherical growth defects occur during production. These cause a defective image comprising a so-called "white dot" (comprising a minute white dot) on a reproduced image. Such spherical growth defects are considered to occur due to abnormal film growth based on a foreign particle, deposited on a substrate on which the deposited film is formed, when a film deposited on the inner face of a deposition chamber is dislodged and lands on the substrate during the formation of the deposited film.

In order to prevent the occurrence of this problem, Japanese Unexamined Patent Publication No. 183871/1992 proposes a deposited film-forming method using a microwave plasma CVD apparatus having a microwave introduction means with two different regions. This document describes that by making the microwave introduction means have a face, which is contacted with plasma generated upon film formation, that has a value of $2\times10^{-2}$ or less in terms of a product of dielectric constant ($\epsilon$) and dissipation factor (tan $\delta$) with respect to the frequency of a microwave used, stable discharge can be caused while preventing a film from depositing on the inner face of a deposition chamber. Thus, a deposited film having improved uniformity and which does not result in detective reproduced images reproduced can be formed. A technique of coating a microwave introduction means with an alumina ceramic by way of a plasma spraying process is described as an optiomal method. According to the technique described in this document, it is understood that a high quality deposited film with few spherical growth defects can be formed.

In recent years, there has been an increased demand for an electrophotographic apparatus with improved performance to provide a high quality reproduced image at a high speed with good durability. In addition, for the electrophotographic apparatus, there is an increased demand for decreased maintenance by improving the reliability of its constituents.

The electrophotographic light receiving member used in the electrophotographic apparatus, has been improved so that it can be continuously used under various environmental conditions over a long period of time without conducting maintenance works.

However, for the electrophotographic light receiving member thus improved, there are still some areas requiring further improvement.

Electrophotographic light receiving members produced by a conventional film-forming apparatus provided with a high frequency power introduction means, sometimes have a defective images having minute white dots depending upon the image-forming conditions employed.

From an industrial standpoint, when the productivity of an electrophotographic light receiving member produced is taken into consideration, to forming a desirable deposited film at a high speed (or a high deposition rate) is an important technical subject.

In order to form a deposited film at a high speed using the conventional film-forming apparatus provided with the high frequency power introduction means, increasing the amount of a film-forming raw material gas introduced into the deposition chamber (the reaction chamber) while increasing the quantity of a discharging power introduced into the deposition chamber is usually employed. However, in the conventional film-forming apparatus not only the electrode, but also the insulating material which covers the electrode are heated to high temperature as the quantity of the high frequency applied to the electrode is increased. As a result, problems related to the film-forming apparatus such as peeling of the film deposited on the insulating material, breakage of the insulating material due to thermal stress, and the like are liable to occur. In this case, it is difficult to achieve uniform film production at a high rate.

SUMMARY OF THE INVENTION

A principal object of the present invention is to eliminate the foregoing problems in the prior art and to provide a film-forming method and apparatus which enable efficient and stable formation of a high quality deposited film without the occurrence of spherical growth defects found in the prior art, whereby a high quality electrophotographic light receiving member which stably and continuously provides a high quality image free of minute white dots can be efficiently produced.

Another object of the present invention is to provide a film-forming method and apparatus which enables efficient production of a high quality electrophotographic light receiving member even when the formation of a deposited film is conducted at a high speed (a high deposition rate).

A further object of the present invention is to provide a film-forming method which comprises the steps of arranging a substrate for film formation in a reaction chamber capable of being evacuated introducing a film-forming raw material gas into said reaction chamber, and simultaneously introducing a high frequency power into said reaction chamber through a high frequency power introduction means, thereby causing glow discharge in said reaction chamber to form a deposited film on said substrate. The high frequency power introduction means comprises at least an electrode for introducing said high frequency power into said reaction chamber and an insulating member which covers said electrode such that the surface of the electrode is isolated from glow discharge caused in said reaction chamber. The electrode is provided with a plurality of gas ejection holes for ejecting gas against an inner face of said insulating member, wherein the formation of said deposited film on said substrate is conducted while ejecting said gas from said gas ejection holes of said electrode.

A further object of the present invention is to provide a film-forming method which comprises the steps of arranging a substrate for film formation in a reaction chamber capable of being evacuated introducing a film-forming raw material gas into said reaction chamber, and simultaneously, introducing a high frequency power into said reaction chamber through a high frequency power introduction means arranged in said reaction chamber, thereby causing glow discharge in said film-forming raw material gas introduced into said reaction chamber to form a deposited film on said substrate. The high frequency power introduction means comprises a tubular electrode capable of serving also as a gas feed means and is provided with one or more gas ejection holes for ejecting gas at the periphery thereof and an insulating member arranged to cover said electrode while having a clearance between said electrode and said insulating member so that said electrode is isolated from said glow discharge caused in said reaction chamber. The formation of said deposited film on said substrate is conducted while ejecting said gas from said gas ejection holes to said insulating member to cool said insulating member.

A further object of the present invention is to provide a film-forming apparatus comprising a reaction chamber capable of being evacuated a substrate holding means for arranging a substrate for film formation in said reaction chamber, a raw material gas introduction means for introducing a film-forming raw material gas into said reaction chamber, and a high frequency power introduction means for introducing a high frequency power into said reaction chamber, wherein said high frequency power introduction means comprises at least an electrode for introducing said high frequency power into said reaction chamber. The insulating member covers said electrode so that the surface of the electrode is isolated from glow discharge caused in said reaction chamber. The electrode is also provided with a plurality of gas ejection holes for ejecting gas against an inner face of said insulating member.

A further object of the present invention is to provide a film-forming apparatus comprising a reaction chamber capable of being evacuated, a substrate holding means for arranging a substrate for film formation in said reaction chamber, a raw material gas introduction means for introducing a film-forming raw material gas into said reaction chamber, and a high frequency power introduction means for introducing a high frequency power into said reaction chamber. The high frequency power introduction means has a hollow portion and means comprises an electrode having one or more gas ejection holes communicated with said hollow portion, and an insulating material provide about said electrode to oppose said ejection holes of said electrode so that said electrode is isolated from the inside of said reaction chamber.

BRIEF DESCRIPTION OF THE DRAWINGS

FIG. 3 is a schematic cross-sectional view illustrating an example of an electrophotographic light receiving member produced in the present invention.

FIG. 4(A) is a schematic diagram illustrating an example of the constitution of a film-forming apparatus, which is used in comparative experiments and comparative examples which will be later described.

FIG. 4(B) is a schematic cross-sectional view taken along the B–B' line in FIG. 4(A)

DESCRIPTION OF THE INVENTION AND PREFERRED EMBODIMENTS

Figure 1:
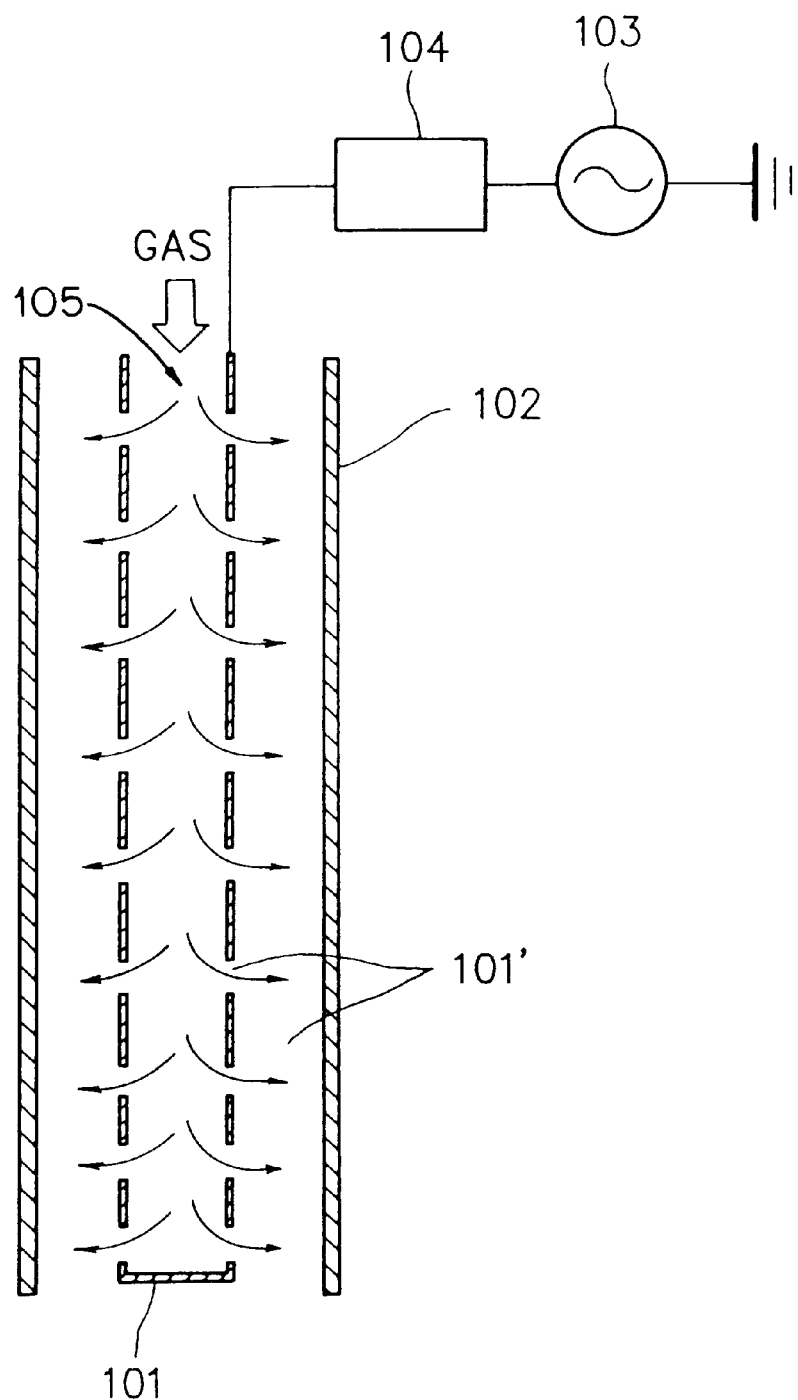
FIGS. 1 and 6 are schematic cross-sectional views respectively illustrating a preferable example of a high frequency power introduction means in the present invention.

The present invention attains the foregoing objects. An aspect of the present invention is directed to a film-forming method by way of plasma CVD (hereinafter referred to as plasma CVD film-forming method) which permits efficient and continous formation of a high quality deposited film having excellent characteristics. Another aspect of the present invention is directed to a film-forming apparatus by way of plasma CVD (hereinafter referred to as plasma CVD film-forming which permits efficient and continous formation of a high quality deposited film having excellent characteristics.

The plasma CVD film-forming method and apparatus according to the present invention permits efficient production of a high quality semiconductor device having an improved performance at a reasonable production cost. The semiconductor device can include a semiconductor circuit element, an electrophotographic light receiving member, an image input line sensor, an image pickup device, and a photovoltaic device (a solar cell).

As previously described, the film-forming method according to the present invention includes the following two typical embodiments.

One typical embodiment of the film-forming method according to the present invention comprises the steps of arranging a substrate for film formation in a reaction chamber capable of being evacuated, introducing a film-forming raw material gas into said reaction chamber, and simultaneously, introducing a high frequency power into said reaction chamber through a high frequency power introduction means, thereby causing glow discharge in said reaction chamber to form a deposited film on said substrate. The high frequency power introduction means comprises at least an electrode for introducing said high frequency power into said reaction chamber and an insulating member which covers said electrode such that the surface of the electrode is isolated from said glow discharge caused in said reaction chamber. The electrode is provided with a plurality of gas ejection holes for ejecting gas against an inner face of said insulating member formation of said deposited film on said substrate is conducted while ejecting said gas from said gas ejection holes of said electrode.

Another typical embodiment of the film-forming method according to the present invention comprises the steps of arranging a substrate for film formation in a reaction chamber capable of being evacuated, introducing a film-forming raw material gas into said reaction chamber, and simultaneously, introducing a high frequency power into said reaction chamber through a high frequency power introduction means arranged in said reaction chamber, thereby causing glow discharge in said film-forming raw material gas introduced into said reaction chamber to form a deposited film on said substrate. The high frequency power introduction means comprises a tubular electrode capable of serving also as a gas feed means and is provided with one or more gas ejection holes for ejecting gas at the periphery thereof and an insulating member arranged to cover said electrode while having a clearance from said insulating member and said electrode so that said electrode is isolated from said glow discharge caused in said reaction chamber and said electrode. The formation of the deposited film on said substrate is conducted while ejecting gas from said gas ejection holes to said insulating member to cool said insulating member.

Similarly, as previously described, the film-forming apparatus according to the present invention includes the following two typical embodiments.

One typical embodiment of the film-forming apparatus according to the present invention comprises a reaction chamber capable of being evacuated, a substrate holding means for arranging a substrate for film formation in said reaction chamber, a raw material gas introduction means for introducing a film-forming raw material gas into said reaction chamber, and a high frequency power introduction means for introducing a high frequency power into said reaction chamber. The high frequency power introduction means comprises at least an electrode for introducing said high frequency power into said reaction chamber and an insulating member which covers a surface of said electrode such that the surface of the electrode is isolated from glow discharge caused in said reaction chamber. The and said electrode is provided with a plurality of gas ejection holes for ejecting gas against an inner face of said insulating member.

Another typical embodiment of the film-forming apparatus according to the present invention comprises a reaction chamber capable of being evacuated, a substrate holding means for arranging a substrate for film formation in said reaction chamber, a raw material gas introduction means for introducing a film-forming raw material gas into said reaction chamber, and a high frequency power introduction means for introducing a high frequency power into said reaction chamber. The high frequency power introduction means has a hollow portion, and said high frequency power introduction means comprises an electrode having one or more gas ejection holes communicated with said hollow portion, and an insulating material provided about said electrode to oppose said gas ejection holes so that said electrode is isolated from the inside of said reaction chamber.

The inventor of the present invention conducted experimental studies in order to solve the foregoing problems found in the prior art to obtain such findings as will be described below. The present invention has been accomplished on the basis of the findings obtained.

As previously described, for an electrophotographic light receiving member produced by a film-forming apparatus provided with a high frequency power introduction means comprising a high frequency power introduction electrode (hereinafter referred to as "high frequency electrode" for simplification purposes) and the like (this film-forming apparatus will be hereinafter referred to as "high frequency plasma CVD film-forming apparatus"), the occurrence of spherical grown defects during production affected yield.

To prevent such spherical growth defects from occurring, coating the surface of the high frequency electrode and the high frequency power introduction means by an alumina ceramic or the like can be done in accordance with the previously described plasma spraying process. The alumina ceramic has a greater surface energy in comparison with metals, and therefore, it is effective as a means to prevent peeling of a film. In this connection, the present inventor conducted experiments on providing a cover made of a ceramic material at the surface of the high frequency electrode. However, it was found that in the case of using such cover, although effective results can be obtained under certain conditions, when the quantity of the high frequency power introduced is increased in order to form a deposited film at a high speed (a high deposition rate) as previously described, a film deposited on the surface of the cover peels off to provide minute particles, and these particles eventually contaminate the deposited film formed on a substrate, where spherical growth defects occur in the deposited film. In addition, it was found that in the case where the quantity of the high frequency power introduced is excessive, the cover itself is sometimes broken to contaminate the deposited film formed on the substrate.

It is the inventor's belief that as the quantity of the high frequency power introduced is increased, the high frequency electrode and the cover thereof are heated to high temperature. When the temperature of the cover reaches a certain temperature or above, significant changes occur in the film deposited on the cover and as a result, the film peels off to provide minute fine particles.

The present inventor conducted experimental studies by designing the high frequency electrode of the high frequency power introduction means to have a hollow structure and providing a cooling mechanism at the hollow structure. As a result, somewhat acceptable results were obtained, but they were not sufficient.

In order to improve the effect of cooling the high frequency power introduction means, there can be considered a structure to close-contact the high frequency electrode with the cover such that no clearance is present between the high frequency electrode and the cover. However, to do so is practically impossible. For instance, when the high frequency electrode is thermally expanded, because the coefficient of thermal expansion of the high frequency electrode is different from that of the cover (made of a ceramic material), it is necessary to provide a certain clearance between the high frequency electrode and the cover. In addition, in view of mechanically caulking the high frequency electrode and the cover, because the tenacity of the ceramic material (by which the cover is constituted) is smaller than that of the metal (by which the high frequency electrode is constituted), unless a certain clearance is provided between the high frequency electrode and the cover, the cover is liable to suffer from breakage. Therefore, it is essential to provide an appropriate clearance between the high frequency electrode and the cover.

Further, during the experimental studies to accomplish the present invention, the present inventor obtained a finding that as the quantity of the high frequency power introduced is increased, the high frequency electrode tends to have unevenness in the temperature distribution therein. The mechanism for this is not clear enough at the present time, but it considered to be deeply related to the transmittance of electromagnetic waves. Particularly, it was found that a tip portion of the high frequency electrode is easily heated to a high temperature in comparison with other portions thereof and because of this, even when the high frequency electrode should be uniformly cooled, a temperature gradient occurs in terms of the temperature distribution in the high frequency power electrode.

Because of such reasons as above described, it was found that by using the high frequency power introduction means which is designed to have the structure above described (which comprises the cover (made of the ceramic material) provided to cover the surface of the high frequency electrode), it is difficult to the high speed formation of a high quality deposited film, which is free of the occurrence of a white dot on a reproduced image, at a high productivity and high level on an industrial scale.

The present invention has been accomplished on the basis of such findings as above described.

A principal feature of the present invention lies in a high frequency power introduction means used in the formation of a deposited film on a given substrate by way of high frequency plasma CVD process.

A typical embodiment of a high frequency power introduction means comprises a structural body comprising an electrode (a high frequency electrode) and an insulating material (that is, an electrode cover comprising an insulating material as a matrix), said electrode being covered by said insulating material such that the surface of said electrode is isolated from glow discharge which is caused upon film formation. The electrode has a structure for ejecting gas to the inner face of the electrode cover, which faces the surface of the electrode, to effectively cool the electrode cover.

Specifically the electrode is structured to have one or more gas ejection holes capable of ejecting gas against the inner face of the electrode cover through said gas election holes thereby cooling the electrode cover.

By this, the temperature of the outer surface of the electrode cover, which is contacted with said glow discharge, can be properly controlled as desired.

The high frequency power introduction means comprising the above described structural body solves the foregoing problems due to the increase in the quantity of the high frequency power introduced.

The electrode may be structured to have a plurality of gas ejection holes arranged such that gas can variously ejected against the inner face of the electrode cover. For instance, it is possible for the gas ejection holes provided at the electrode to be arranged such that much gas is ejected against a given portion of the inner face of the electrode cover, which will suffer from significant temperature increase. In this case, the temperature gradient at the surface of the electrode cover in terms of the temperature distribution can be desirably diminished, where the performance of the high frequency power introduction means is improved.

For the electrode (the high frequency electrode) as the high frequency power introduction means, it may be constituted by an appropriate electrically conductive material which efficiently transmits a high frequency power into a reaction chamber (a deposition chamber), excels in physical strength, and is sufficiently durable against use-environments including temperature and plasma. Preferable examples of such material are metals such as Al, Ti, Cr, Fe, Ni, and Co, and alloys of these metals such as stainless steels.

For the electrode (the high frequency electrode) as the high frequency power introduction means in the present invention, it is required to efficiently transmit a high frequency power into the reaction chamber (the deposition chamber). In addition to this, the electrode is required to have a gas ejection means (comprising one or more gas ejection holes) for ejecting gas from the inside toward the inner face of the electrode cover by which the electrode is covered. Therefore, the electrode is desired to be shaped in a hollow form, namely, a so-called pipe-like form. Specifically, the shape of the electrode can include, for example, a hollow cylindrical form and a hollow columnar form.

For the gas election holes (as the gas ejection means) provided at the electrode (shaped in the hollow form), it is necessary to have due regard about their form, size and arrangement distribution (numerical aperture). In view of substantially achieving the effects of the present invention, each of the gas ejection holes may be in a circular or slit-like form. For the area of each of the gas election holes, it is desired to be within a range of decreasing the transmission efficiency of the high frequency power. Similarly, the numerical aperture of the gas election holes is also desired to be within a range of decreasing the transmission efficiency of the high frequency power.

The flow rate of the gas ejected from the electrode and the factors related to the gas ejection holes (provided at the electrode) including their form, arrangement distribution, and the like should be properly determined depending upon film-forming conditions employed. Besides, in the present invention, for the surface temperature of the electrode cover during the formation of a deposited film, it is desired to be controlled in the range of 200 to 500° C.

For the size of the electrode, there is no particular limitation. However, in the case where a plurality of electrically conductive substrates, particularly, a plurality of electrically conductive cylindrical substrates, are spacedly arranged on a common circumference so as to circumscribe the electrode, the size of the electrode (that is, the diameter of the entirety of the cylindrical (or columnar) high frequency power introduction means) is desired to be designed to be of a dimension corresponding to a figure of 4 to 25% of the diameter of the circle on which the substrates are arranged.

For the gas ejected from the electrode, it is desired to comprise inert gas in view of imparting no adverse effect to a deposited film formed on a substrate in the film-forming space and not disturbing plasma generated in said film-forming space, when said gas should enter into said film-forming space. Specific examples of such inert gas are He gas, Ar gas, Ne gas, Xe gas, and mixtures of two or more these gases. Besides, $H_2$ gas is also usable. However, $H_2$ gas it contributes to reaction of a film-forming raw material gas, and therefore, when $H_2$ gas is ejected from the electrode and enters into the film-forming space, by referring to the prescription (the concentration, flow rate and the like) for the film-forming raw material gas, the amount of the $H_2$ gas to be introduced into the electrode is adjusted.

As above described, the electrode cover by which the electrode is covered comprises the insulating material as the matrix. The insulating material can include alumina ceramics, aluminum nitride, boron nitride, zircon, cordierite, zircon-cordierite, silicon oxide, beryllium oxide, mica series ceramics, quartz glass, pyrex glass, and the like.

The electrode cover is desired to be shaped in a cylindrical form (or a columnar form).

At least a surface of the electrode cover which is contacted with glow discharge in the reaction chamber may have an irregular surface provided with a plurality of irregularities chiefly to prevent a film deposited thereon from peeling. It is desired for the irregularities in this case to be in the range of 5 to 200 µm in terms of Rz (ten points-average roughness based on a standard length of 2.5 mm). Forming such irregularities at said surface of the electrode cover may be conducted by a conventional manner. It is desired for the irregularities to be formed by blast processing of spraying projectiles such as abrasives.

For the size of the electrode cover (in a cylindrical form), there is no particular limitation. However, in the case where a plurality of electrically conductive substrates, particularly, a plurality of electrically conductive cylindrical substrates, are spacedly arranged on a common circumference so as to circumscribe the electrode covered by the electrode cover, the size of the cylindrical form of the electrode cover (that is, the diameter of the entirety of the cylindrical (or columnar) high frequency power introduction means) is desired to be designed to be of a dimension corresponding to a figure of 4 to 25% of the diameter of the circle on which the substrates are arranged.

For the thickness of the cylindrical electrode cover, there is no particular limitation. However, in terms of easiness in processing and mechanical strength, it is desired to be in the range of 0.5 to 20 mm.

For the clearance (the distance) between the electrode cover and the electrode covered by the electrode cover, when it is excessively small, the electrode cover is liable to suffer from breakage due to the difference between the coefficient of thermal expansion of the electrode and that of the electrode cover (comprising, for example, a ceramic material). When it is excessively large, it is difficult to sufficiently cool the electrode cover and a negative effect is sometimes provided for the transmission of the high frequency power. Although being somewhat different depending upon the constituent of each of the electrode and the electrode cover and also their design, in general, it is desired to be 0.5 to 5 mm.

In the present invention, by applying a high frequency power to the high frequency power introduction means, a film-forming raw material gas is decomposed. For the oscillation frequency of the high frequency power applied, there is no particular limitation. However, the results of the experimental studies by the present inventor have provided the following findings. In the case where the oscillation frequency is less than 50 MHz, glow discharge tends to become unstable depending upon film-forming conditions employed. In the case where the oscillation frequency is beyond 450 MHz, there is a tendency for the transmission characteristics of the high frequency power to deteriorate, and it is sometimes difficult to cause glow discharge. Therefore, the oscillation frequency is the most preferable to be in the range of 50 to 450 MHz.

For the wave form of the oscillation frequency, there is no particular limitation. However, the oscillation frequency is desired to be of a wave form of sine wave or square wave.

In the following, description will be made of the film-forming apparatus according to the present invention with reference to the drawings.

FIG. 1 is a schematic cross-sectional view in a longitudinal direction illustrating an example of the constitution of a high frequency power introduction means according to the present invention.

In FIG. 1, reference numeral 101 indicates a high frequency electrode (that is, a high frequency power introduction electrode), and reference numeral 102 an electrode cover formed of an insulating material. A glow discharge space (not shown) of a reaction chamber (not shown) is situated outside the electrode cover 102. The electrode cover 102 has an inside region, is isolated from the glow discharge space, in the inside. In the inside region of the electrode cover 102, the high frequency electrode 101 is provided.

The high frequency electrode 101 is shaped in a pipe-like form as shown in FIG. 1, and it is provided with a hollow portion 105, a plurality of gas ejection holes 101' as shown in FIG. 1. Gas from a gas supply means (not shown) is introduced into the inside of the high frequency electrode 101, followed by ejecting through the gas ejection holes 101' against the inner face of the electrode cover 102. A connection portion (not shown) between said gas supply means and the high frequency electrode 101 comprises an insulating material in order to transmit a high frequency power only into the reaction chamber (not shown). Reference numeral 103 indicates a high frequency power source. A high frequency power from the high frequency power source 103 is adjusted by a matching box 104, followed by application to the high frequency electrode 101 through a high frequency power transmission circuit (not shown) and a high frequency power introduction terminal (not shown).

Figure 2A:
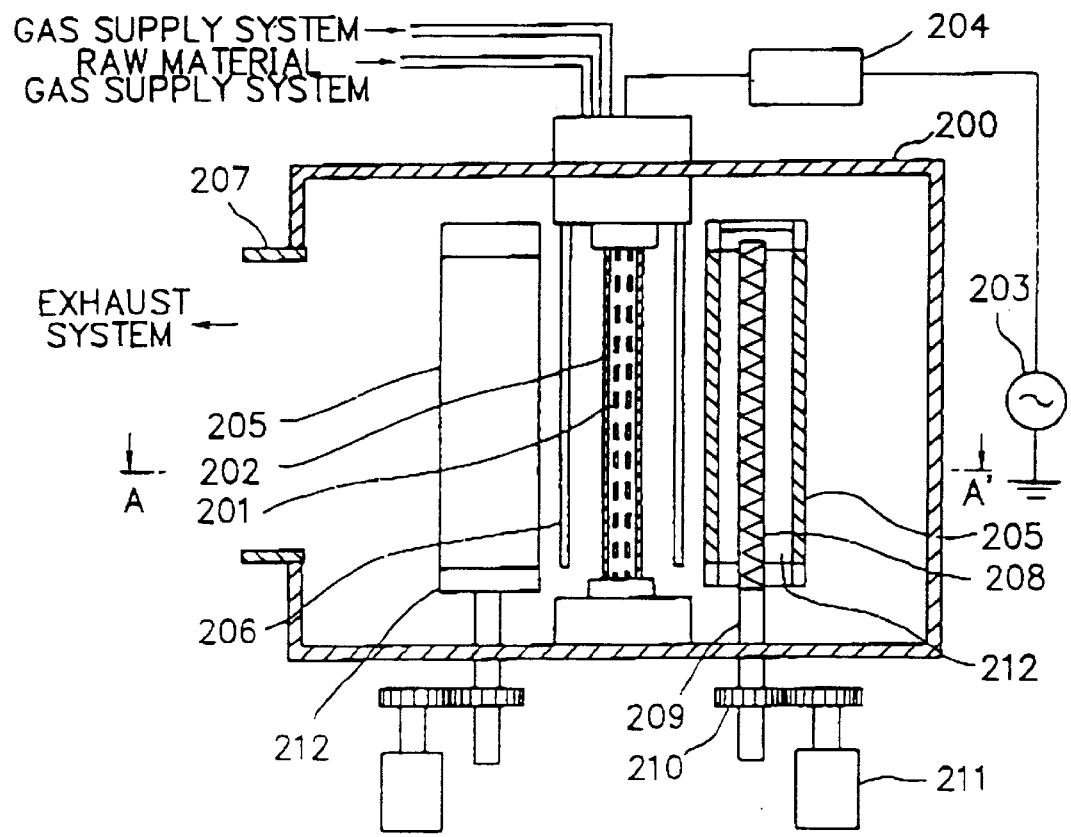
FIG. 2(A) is a schematic diagram illustrating an example of the constitution of a film-forming apparatus according to the present invention.
Figure 2B:
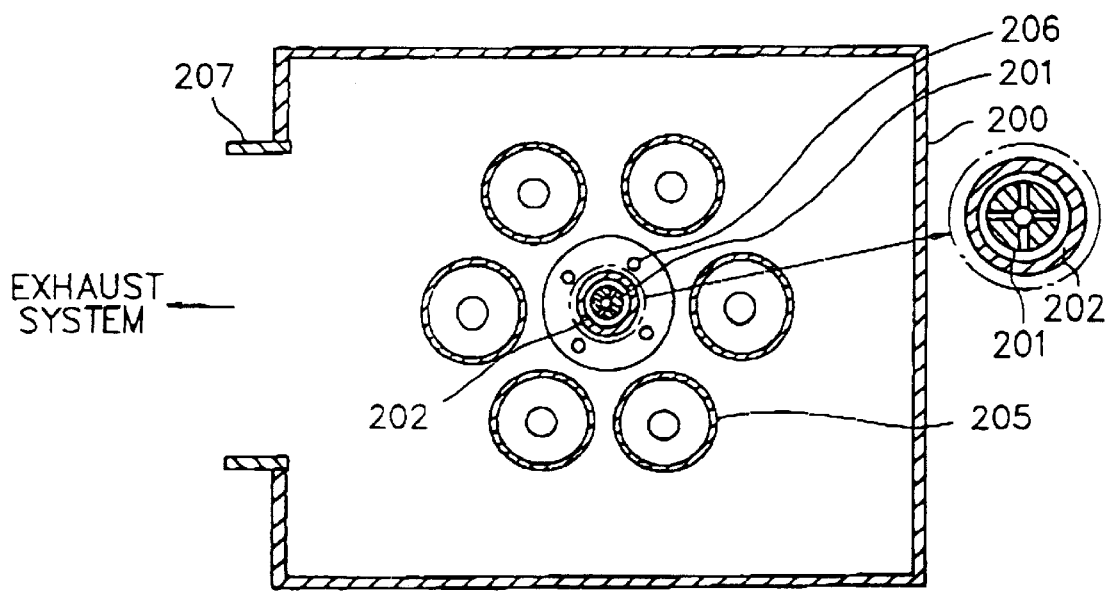
FIG. 2(B) is a schematic cross-sectional view taken along the A–A' line in FIG. 2(A).

FIG. 2(A) is a schematic diagram illustrating an example of the constitution of a film-forming apparatus (that is, a high frequency plasma CVD film-forming apparatus) according to the present invention, in which a high frequency power introduction means having such configuration as shown in FIG. 1 is used. FIG. 2(B) is a schematic cross-sectional view taken along the A–A' line in FIG. 2(A).

In FIGS. 2(A) and 2(B), reference numeral 200 indicates a reaction chamber. Reference numeral 201 indicates a high frequency electrode (a high frequency power introduction electrode) having such configuration (provided with a plurality of gas ejection holes) as shown in FIG. 1, and reference numeral 202 an electrode cover also having such configuration as shown in FIG. 1

Reference numeral 203 indicates a high frequency power source which is electrically connected to the high frequency electrode 201 through a matching box 204. A gas supply pipe (provided with a gas flow regulating valve) extending from a gas supply system (not shown) is connected to the high frequency electrode 201 for introducing gas (inert gas or $H_2$ gas) into the high frequency electrode 201.

Reference numeral 205 indicates a cylindrical substrate positioned on a substrate holder 212 held on a rotary shaft 209 connected to a driving motor 211 through a driving mechanism 210.

Reference numeral 206 indicates a gas feed pipe [provided with a plurality of gas ejection holes (not shown)] which is connected to a raw material gas supply system (not shown). The gas feed pipe 206 serves to introduce a film-forming raw material gas.

Reference numeral 208 indicates a heater for heating the cylindrical substrate 205, which is installed in the substrate holder 212.

The reaction chamber 200 is provided with an exhaust pipe 207 connected to an exhaust device comprising a vacuum pump through an exhaust pipe (not shown).

In the film-forming apparatus shown in FIGS. 2(A) and 2(B), a deposited film can be formed concurrently on six substrates.

Specifically, as shown in FIGS. 2(A) and 2(B), six cylindrical substrates 205 are spacedly arranged on a common circumference to establish an inner space (a discharge space) circumscribed by the cylindrical substrates 205 in the reaction chamber 200.

During film formation, it is possible to rotate each of the cylindrical substrates 205 by rotating the rotary shaft 209 by actuating the driving motor 211 to drive the driving mechanism 210. In this case, it is possible to concurrently form a deposited film uniformly on each of the cylindrical substrates.

Description will be made of film formation using the film-forming apparatus shown in FIGS. 2(A) and 2(B).

The formation of a deposited film using the film-foming apparatus shown in FIGS. 2(A) and 2(B) may be conducted, for instance, in the following manner.

Six well-cleaned cylindrical substrates 205 are positioned on the substrate holders 212 in the reaction chamber 200 as shown in FIGS. 2(A) and 2(B).

The inside of the reaction chamber 200 is evacuated to a desired vacuum degree through the exhaust pipe 207 by actuating the exhaust device (not shown). By actuating the heaters 208, the cylindrical substrates 205 are heated to and maintained at a desired temperature. Film-forming raw material gases from the raw material gas supply system (not shown) are introduced into the inner space (the discharge space) circumscribed by the cylindrical substrates 205 through the gas feed pipes 206, where due regards should be made so that no extreme change in the gas pressure in the reaction chamber 200.

After the flow rate of each film-forming raw material gas became constant, the exhaust valve (not shown) properly is regulated to adjust the gas pressure (the inner pressure) in the reaction chamber to a desired degree. Inert gas from the gas supply system (not shown) for the high frequency electrode 201 is introduced into the high frequency electrode 201, followed by ejecting the inert gas against the inner face of the electrode cover 202 through the gas ejection holes (101', see FIG. 1) of the high frequency electrode 201.

After the gas pressure (the inner pressure) in the reaction chamber 200 became constant, the high frequency power source 203 is switched on to apply a high frequency power with a desired frequency and having a desired wattage to the high frequency electrode 201 through the matching box 204. By this, discharging energy is supplied into the inner space (the discharge space) circumscribed by the cylindrical substrates 205, where plasma discharge occurs in the film-forming raw material gases introduced into the inner space, whereby the film-forming raw material gases are decomposed to cause the formation of a deposited film on each of the cylindrical substrates 205.

During the film formation, it is possible to rotate each of the cylindrical substrates 205 by rotating the rotary shaft 209 by actuating the driving motor 211 to drive the driving mechanism 210. In this case, it is possible to concurrently form a deposited film uniformly on each of the cylindrical substrates.

After the completion of the film formation, the application of the high frequency power to the high frequency electrode is terminated, and the introduction of the film-forming raw material gases is terminated.

In the case of forming a stacked structure comprising a plurality of deposited films (a plurality of layers) on each of the cylindrical substrates 205, the above procedures are repeated. In this way, it is possible to mass-produce, for example, a light receiving member having a light receiving layer having a multi-layered structure.

FIG. 3 is a schematic cross-sectional view illustrating an example of such light receiving member usable as an electrophotographic light receiving member (or an electrophotographic photosensitive device) which can be produced according to the present invention.

In FIG. 3, reference numeral 300 indicates the entirety of an electrophotographic light receiving member (hereinafter simply referred to as light receiving member).

The light receiving member 300 comprises a light receiving layer 305 provided on a substrate 301 for a light receiving member. The light receiving layer 305 comprises a charge injection inhibition layer 302, a photoconductive layer 303, and a surface layer 304 stacked in the named order on the substrate 301. The charge injection inhibition layer 302 is not always necessary, and therefore, it may be omitted as desired.

In the following, description will be made of each constituent of the light receiving member 300.

Substrate

The substrate 301 may be either electrically conductive or electrically insulative.

The electrically conductive substrate can include, for example, metals such as Al, Cr, Mo, Au, In, Nb, Te, V, Ti, Pt, Pd, and Fe; and alloys of these metals such as stainless steels.

The electrically insulative substrate can include, for example, films or sheets of synthetic resins such as polyester, polyethylene, polycarbonate, cellulose acetate, polypropylene, polyvinyl chloride, polystyrene and polyamide, glass or ceramics. Any of these films or sheets is desired to be applied with electroconductive treatment to at least a surface thereof on which a deposited film as a light receiving layer of a light receiving member is to be formed. In this case, the remaining surface may be also applied with electroconductive treatment.

The substrate may be of any configuration such as cylindrical, plate-like or belt-like shape having a smooth or irregular surface.

For the thickness of the substrate, it should be properly determined so that a desired light receiving member can be produced. In the case where flexibility is required for the light receiving member, it can be made as thin as possible within a range capable of sufficiently providing the function as the substrate. However, the thickness is usually made to be greater than 10 $\mu$m in view of the fabrication and handling or mechanical strength of the substrate.

It is possible for the substrate to have an uneven surface. For instance, in the case where image formation is conducted using coherent monochromatic light such as laser beams, the substrate may have an uneven surface provided with irregularities in order to prevent the occurrence of defective images caused by a so-called interference fringe pattern being apt to appear in a visible image formed. Such uneven surface of the substrate may be formed by a conventional manner described in Japanese Unexamined Patent Publication No. 168156/1985, 178457/1985, or 225854/1985.

The irregularities of the uneven surface of the substrate may be based on a plurality of spherical dimples. Particularly, the irregularities may comprise a plurality of spherical dimples whose sizes are smaller than the resolution required for a light receiving member (that is, an electrophotographic light receiving member). The formation of the irregularities based on such spherical dimples at a surface of the substrate may be conducted by a conventional manner described in Japanese Unexamined Patent Publication No. 231561/1986.

Light Receiving Layer

As previously described, the light receiving layer 302 basically comprises the photoconductive layer 303 and the surface layer 304. If necessary, the charge injection inhibition layer 302 is interposed between the substrate 301 and the photoconductive layer 303.

The photoconductive layer 303 may comprise an amorphous silicon material containing silicon atoms (Si) as a matrix and hydrogen atoms (H) or/and halogen atoms (X) (hereinafter referred to as "a-Si:(H,X)") and having photoconductivity.

The surface layer 304 may comprise an appropriate amorphous silicon series material. The charge injection inhibition layer 302 may also comprise an appropriate amorphous silicon series material.

In the following, description will be made of the formation of each constituent layer of the light receiving layer 305 in the production of a light receiving member having such configuration as above described.

Photoconductive Layer 303

In order to form, for instance, an amorphous silicon (a-Si) deposited film as the photoconductive layer 303, an appropriate raw material in the gaseous state capable of supplying Si is used. Such raw material can include, for example, gaseous or gasifiable silicon hydrides (silanes). Specific examples are $SiH_4$, $Si_2H_6$, $Si_3H_8$, $Si_4H_{10}$, etc. Of these, $SiH_4$ and $Si_2H_6$ are particularly preferred in view of the easy layer forming work and the good efficiency for the supply of Si. These Si-supplying compounds may be used either singly or in combination with two or more of them.

Besides, gaseous or gasifiable fluorine-containing silicon compounds, namely, fluorine-substituted silane derivatives, such as $SiF_4$ and $Si_2F_6$, and gaseous or gasifiable fluorine-substituted silicon hydrides such as $SiH_3F$, $SiH_2F_2$, and $SiHF_3$ are also usable as the Si-supplying raw material. These Si-supplying compounds may be used either singly or in combination with two or more of them.

If necessary, any of the above mentioned Si-supplying raw materials may be diluted with an appropriate dilution gas such as $H_2$ gas, He gas, Ar gas, or Ne gas.

The amorphous silicon deposited film as the photoconductive layer 303 may contain a dopant comprising atoms of a conductivity controlling element belonging to group IIIb of the periodic table which provide a p-type conductivity (these atoms will be hereinafter referred to as group IIIb atoms) or atoms of a conductivity controlling element belonging group Vb of the periodic table which provide an n-type conductivity (these atoms will be hereinafter referred to as group Vb atoms).

In order for the amorphous silicon deposited film as the photoconductive layer 303 to contain such a dopant, an appropriate raw material capable of supplying group IIIb or Vb atoms is used in addition to the foregoing Si-supplying raw material.

Such group IIIb or Vb atoms-supplying raw material can include raw materials capable of supplying group IIIb or Vb atoms, which are in the gaseous state at room temperature or can be easily gasified at least under the conditions for the formation of the deposited film.

Such group IIIb atoms-supplying gaseous or gasifiable raw material can include boron hydrides such as $B_2H_6$, and $B_4H_{10}$, and boron halides such as $BF_3$, and $BCl_3$.

Such group Vb atoms-supplying gaseous or gasifiable raw material can include phosphorous hydrides such as $PH_3$ and $P_2H_4$, and phosphorous halides such as $PH_4I$, $PF_3$, $PCl_3$, $PBr_3$, and $PI_3$.

Any of these group IIIb or Vb atoms-supplying raw materials may be diluted with a dilution gas such as $H_2$ gas, He gas or the like, if necessary.

If necessary, the amorphous silicon as the photoconductive layer 303 may contain at least one kind of atom selected from carbon atoms (C), oxygen atoms (O), and nitrogen atoms (N) [hereinafter referred to as "atoms (C,O,N)"].

In order for the amorphous silicon deposited film as the photoconductive layer 303 to contain atoms (C,O,N), an appropriate raw material capable of supplying atoms (C,O,N) is used in addition to the foregoing Si-supplying raw material.

As such raw material gas capable of supplying C (carbon atoms) which is used in the formation of the photoconductive layer, there can be mentioned, for example, gaseous or gasifiable hydrocarbons $CH_4$, $C_2H_6$, $C_3H_8$, $C_4H_{10}$, and the like. Of these, $CH_4$ and $C_2H_6$ are particularly preferred in view of the easy layer forming work and the good efficiency for the supply of C. These C-supplying compounds may be used either singly or in combination with two or more of them. If necessary, these C-supplying raw materials may be diluted with an appropriate dilution gas such as $H_2$ gas, He gas, Ar gas, or Ne gas.

As such raw material gas capable of supplying O (oxygen atoms) which is used in the formation of the photoconductive layer there can be mentioned, for example, $O_2$, $O_3$, $CO_2$, and the like. As such raw material gas capable of supplying N (nitrogen atoms) which is used in the formation of the photoconductive layer, there can be mentioned, for example, $N_2$, $NH_3$, $HN_3$, $H_2NNH_2$, $NH_3N_3$, $NH_4N_3$, and the like. Besides, NO, $NO_2$, $N_2O$, $N_2O_3$, $N_2O_4$, $N_2O_5$, and $NO_3$ which are capable of supplying O (oxygen atoms) and N (nitrogen atoms) at the same time are also usable.

If necessary, these raw materials may be diluted with an appropriate dilution gas such as $H_2$ gas, He gas, Ar gas, or Ne gas.

The thickness of the photoconductive layer 303, should be properly determined having due regard not only on the electrophotographic characteristics desired for the resulting electrophotographic light receiving member, but also on cost. In view of this, thickness is preferably in the range of 15 to 50 $\mu$m, more preferably in the range of 20 to 45 $\mu$m, or most preferably in the range of 25 to 40 $\mu$m.

In order to form a photoconductive layer (comprising an amorphous silicon (a-Si) material) having desired properties, it is necessary that the mixing ratio of the Si-supplying raw material gas and the dilution gas, the gas pressure (the inner pressure) in the reaction chamber, the discharging power, and the substrate temperature upon layer formation are properly adjusted depending upon the requirements involved.

For the flow rate the dilution gas (comprising $H_2$ gas, He gas, or a mixture of these gases), its optimum range should be determined in accordance with a previously established layer design. However, in general, the flow rate of the dilution gas is desired to be preferably in the range of 1 to 20 times, more preferably in the range of 2 to 15 times, most preferably in the range of 3 to 10 times, respectively versus the flow rate of the Si-supplying raw material gas.

The gas pressure (the inner pressure) in the reaction chamber, is desired to be 100 mTorr or less in order to obtain a high quality deposited film as the photoconductive layer. When the gas pressure is excessively low, disadvantages in terms of the productivity and the stability of plasma discharge are likely. In view of this, it is preferably in the range of 3 to 100 mTorr, more preferably in the range of 10 to 80 mTorr.

For the discharging power, its optimum range should be also determined in accordance with the previously established layer and also the configuration of the apparatus used. However, in general, in order to attain a sufficient deposition rate and desired characteristics for a deposited film formed, it is desired to be preferably in the range of 1 to 20 times, more preferably in the range of 2 to 15 times, most preferably in the range of 3 to 10 times, respectively versus the flow rate of the Si-supplying raw material gas.

For the substrate temperature, its optimum range should be also determined in accordance with the previously established layer design. However, in general, it is desired to be preferably in the range of 200 to 350° C., more preferably in the range of 230 to 330° C., most preferably in the range of 250 to 310° C.

However, the actual conditions for forming a desired deposited film as the photoconductive layer 303 such as the substrate temperature and the gas pressure in the reaction chamber cannot usually be determined with ease independent of each other. Accordingly, the conditions optimal to the film formation are desirably determined based on relative and organic relationships for forming a deposited film having desired properties suitable as the photoconductive layer 303.

Surface Layer 304

The surface layer 304 may comprise an appropriate amorphous silicon series material or an appropriate amorphous carbon series material. As preferable examples of such amorphous silicon series material, there can be mentioned, an amorphous silicon carbide (hereinafter referred to as "a-SiC"), an amorphous silicon material containing carbon atoms (C) and hydrogen atoms (H) or/and halogen atoms (X) (hereinafter referred to as "a-SiC:(H,X)"), an amorphous silicon material containing oxygen atoms (O) and hydrogen atoms (H) or/and halogen atoms (X) (hereinafter referred to as "a-SiO:(H,X)"), an amorphous silicon material containing nitrogen atoms (N) and hydrogen atoms (H) or/and halogen atoms (X) (hereinafter referred to as "a-SiN:(H,X)"), and an amorphous silicon material containing at least two kinds of atoms selected from the group consisting of carbon atoms (C), oxygen atoms (O) and nitrogen atoms (N), and hydrogen atoms (H) or/and halogen atoms (X) (hereinafter referred to as "a-SiCON:(H,X)"). As such amorphous carbon series material, there can be mentioned an amorphous carbon material (a-C) and an amorphous carbon material containing carbon atoms (C) as a matrix and hydrogen atoms (H) or/and hydrogen atoms (X) (hereinafter referred to as "a-C:(H,X)").

The surface layer 304 may be formed by means of a vacuum deposition film-forming manner under film-forming conditions previously established so that a deposited film having desired properties as the surface layer can be formed. However, in view of the productivity of a light receiving member (an electrophotographic light receiving member) produced, it is desired for the surface layer 304 to be formed in the same manner of forming the photoconductive layer 303. The foregoing film-forming conditions for the formation of the photoconductive layer 303 can be employed in the formation of the surface layer 304.

As above described, the surface layer 304 may comprise any amorphous silicon series material or any amorphous carbon series material. However, in a preferred embodiment, the surface layer comprises an amorphous silicon material containing at least one kind of atom selected from the carbon atoms (C), oxygen atoms (O) and nitrogen atoms (N) such as a-Sic, a-SiC:(H,X), a-SiO:(H,X), a-SiN:(H,X), or a-SiCON:(H,X). In the most preferred embodiment, the surface layer comprises a-SiC.

As the raw material gas capable of supplying Si which is used in the formation of the surface layer, there can be mentioned, for example, gaseous or gasifiable silicon hydrides (silanes). Specific examples are $SiH_4$, $Si_2H_6$, $Si_3H_8$, $Si_4H_{10}$, etc. Of these, $SiH_4$ and $Si_2H_6$ are particularly preferred in view of the easy layer forming work and the good efficiency for the supply of Si. These Si-supplying compounds may be used either singly or in combination with two or more of them.

If necessary, any of the above mentioned Si-supplying raw materials may be diluted with an appropriate dilution gas such as $H_2$ gas, He gas, Ar gas, or Ne gas.

As the raw material gas capable of supplying C (carbon atoms) which is used in the formation of the surface layer, there can be mentioned, for example, gaseous or gasifiable hydrocarbons $CH_4$, $C_2H_6$, $C_3H_8$, $C_4H_{10}$, and the like. Of these, $CH_4$ and $C_2H_6$ are particularly preferred in view of the easy layer forming work and the good efficiency for the supply of C. These C-supplying compounds may be used either singly or in combination with two or more of them.

If necessary, any of the above mentioned C-supplying raw materials may be diluted with an appropriate dilution gas such as $H_2$ gas, He gas, Ar gas, or Ne gas.

As the raw material gas capable of supplying O (oxygen atoms) or/and N (nitrogen atoms) which is used in the formation of the surface layer, those mentioned in the formation of the photoconductive layer 303 can be selectively used.

For the thickness of the surface layer 304, it is preferably in the range of 0.01 to 3 μm, more preferably in the range of 0.05 to 2 μm, or most preferably in the range of 0.1 to 1 μm. In the case where the surface layer is of a thickness of less than 0.01 μm, occasionally the surface layer is lost due to abrasion or the like during repeated use of the light receiving member. On the other hand, in the case where the surface layer is of a thickness of beyond 3 μm, occasionally the electrophotographic characteristics deteriorate such as an increase in the residual potential occurs.

Charge Injection Inhibition Layer 302

The charge injection inhibition layer 302 may comprise an amorphous silicon series material containing atoms of a conductivity controlling element as well as the photoconductive layer 303.

The charge injection inhibition layer 302 has a rectification property of preventing a charge carrier from being injected from the substrate side into the photoconductive layer 303 when one polarity charge is applied on the surface of the light receiving layer 305 and of not exhibiting said function when the other polarity charge is applied thereon. Thus, the charge injection inhibition layer has so-called polarity dependency.

In order for the charge injection inhibition layer to have such function as above described, the charge injection inhibition layer is incorporated with atoms of a conductivity controlling element (hereinafter referred to as "conductivity controlling atoms") in a relatively large amount in comparison with that of the dopant (comprising the conductivity controlling atoms) contained in the photoconductive layer 303.

The charge injection inhibition layer 302 may contain the conductivity controlling atoms such that they are evenly contained in the entire layer region in terms of the concentration distribution.

Alternatively, it is possible for the charge injection inhibition layer to contain the conductivity controlling atoms in the thickness direction at a uniform concentration distribution, where the charge injection inhibition layer has a partial layer region containing the conductivity controlling atoms at an uneven concentration distribution.

In the case where the concentration distribution of the conductivity controlling atoms contained in the charge injection inhibition layer is uneven, it is desired for the concentration distribution to be enhanced on the substrate side.

However, in any case, it is necessary for the conductivity controlling atoms to be evenly contained in the in-plane direction in parallel to the surface of the substrate at a uniform concentration distribution, in order for the charge injection inhibition layer to have uniform properties in the in-plane direction.

As the conductivity controlling atoms contained in the charge injection inhibition layer, so-called impurities in the field of the semiconductor can be mentioned, and those usable herein can include atoms of elements belonging to group IIIb of the periodic table which provide a p-type conductivity and atoms of elements belonging to group Vb of the periodic table which provide an n-type conductivity.

Specific examples of the group IIIb element are B, Al, Ca, In, and Tl. Of these elements, B, Al and Ga are particularly preferable. Specific examples of the group Vb elements are P, As, Sb, and Bi. Of these elements, P and As are particularly preferable.

For the amount of the conductivity controlling atoms contained in the charge injection inhibition layer, it is preferably in the range of from 10 to $1\times10^4$ atomic ppm, more preferably in the range of from 50 to $5\times10^3$ atomic ppm, or most preferably in the range of from $1\times10^2$ to $1\times10^3$ atomic ppm.

The charge injection inhibition layer may contain at least one kind of atom selected from the group consisting of carbon atoms (C), nitrogen atoms (N) and oxygen atoms (O) [hereinafter referred to as "atoms(C,N,O)"]. In this case, the adhesion of the charge injection inhibition layer with the photoconductive layer is improved.

The charge injection inhibition layer 302 may contain the atoms (C,N,O) such that they are evenly contained in the entire layer region in terms of the concentration distribution.

Alternatively, it is possible for the charge injection inhibition layer to contain the atoms (C,N,O) in the thickness direction at a uniform concentration distribution, where the charge injection inhibition layer has a partial layer region containing the atoms (C,N,O) at an uneven concentration distribution.

However, in any case, it is necessary for the atoms (C,N,O) to be evenly contained in the in-plane direction in parallel to the surface of the substrate at a uniform concentration distribution, in order for the charge injection inhibition layer to have uniform properties in the in-plane direction.

The amorphous silicon series material to constitute the charge injection inhibition layer 302 desirably contains hydrogen atoms (H) in order to compensate dangling bonds present therein and also order to improve the quality.

For the thickness of the charge injection inhibition layer 302, it should be properly determined having due regard not only on the electrophotographic characteristics desired for the resulting electrophotographic light receiving member but also on economic effects. In view of this, it is preferably in the range of 0.1 to 5 μm, more preferably in the range of 0.3 to 4 μm, or most preferably in the range of 0.5 to 3 μm.

The charge injection inhibition layer 302 may be formed in accordance with the foregoing manner for the formation of the photoconductive layer 303. Particularly, as well as in the case of forming the photoconductive layer 303, in order to form a charge injection inhibition layer (comprising an amorphous silicon material) having desired properties, the mixing ratio of the Si-supplying raw material gas and the dilution gas, the gas pressure (the inner pressure) in the reaction chamber, the discharging power, and the substrate temperature upon layer formation are properly adjusted depending upon the requirements involved.

For the flow rate the dilution gas (comprising $H_2$ gas, He gas, or a mixture of these gases), its optimum range should be determined in accordance with a previously established layer design. However, in general, the flow rate of the dilution gas is desired to be preferably in the range of 1 to 20 times, more preferably in the range of 3 to 15 times, most preferably in the range of 5 to 10 times, respectively versus the flow rate of the Si-supplying raw material gas.

For the gas pressure in the reaction chamber, it is desired to be 100 mTorr or less in order to obtain a high quality deposited film as the charge injection inhibition layer. When the gas pressure is excessively low, disadvantages in terms of the productivity and the stability of plasma discharge are likely. In view of this, it is preferably in the range of 3 to 100 mTorr, more preferably in the range of 10 to 80 mTorr.

For the discharging power, its optimum range should be also determined in accordance with the previously established layer and also the configuration of the apparatus used. However, in general, it is preferably in the range of 1 to 20 times, more preferably in the range of 2 to 10 times, most preferably in the range of 3 to 5 times, respectively versus the flow rate of the Si-supplying raw material gas.

For the substrate temperature, its optimum range should be also determined in accordance with the previously established layer design. However, in general, it is preferably in the range of 200 to 350° C., more preferably in the range of 230 to 330° C., most preferably in the range of 250 to 310° C.

Separately, in the electrophotographic light receiving member 300, a so-called contact layer comprising a material selected from the group consisting of $Si_3N_4$, $SiO_2$, and $SiO$ or an amorphous silicon series material containing hydrogen atoms (H) or/and halogen atoms (X) and at least one kind of atom selected from the group consisting of carbon atoms (C), oxygen atoms (O) and nitrogen atoms (N) may be interposed between the substrate and the photoconductive layer (in the case where no charge injection inhibition layer is provided) or between the substrate and the charge injection inhibition layer in order to improve the adhesion of the photoconductive layer or the charge injection inhibition layer with the substrate.

Further, in order to prevent occurrence of an infringing pattern due to light reflected from the substrate, a light absorption layer may be provided in the electrophotographic light receiving member 300.

In the following, the effects of the present invention will be described in more detail with reference to experiments and comparative experiments. It should be understood that the scope of the present invention is not restricted by these experiments and examples.

EXPERIMENT 1 AND COMPARATIVE EXAMPLE 1

Experiment 1

The film-forming apparatus shown in FIGS. 2(A) and 2(B) in which the high frequency electrode 201 (that is, the high frequency power introduction electrode) comprises a hollow pipe-like shaped high frequency electrode (made of a SUS 306 stainless steel) of 18 mm in outer diameter and 10 mm in inner diameter and having 4 longitudinal banks each comprising 10 circular gas ejection holes (101', see FIG. 1) having a diameter of 1.5 mm (which are lined at an equal interval) and which are crosswise arranged at an equal interval, and the electrode cover 202 comprises a hollow pipe-like shaped electrode cover (made of a ceramic material) of 26 mm in outer diameter and 20 mm in inner diameter was used.

In accordance with the foregoing procedures for the film formation using the film-forming apparatus shown in FIGS. 2(A) and 2(B), only Ar gas instead of the film-forming raw material gas was introduced into the inner space (the discharge space) circumscribed by the cylindrical substrates though the gas feed pipes 206 to cause plasma discharge in the inner space, under conditions shown in Table 1. At this time, He gas was introduced into the high frequency electrode 201, followed by ejecting the He gas against the inner face of the electrode cover 202 through the gas ejection holes of the high frequency electrode.

After the plasma discharge was continued for 60 minutes, the temperature distribution of the surface of the electrode cover 202 was measured by means of an infrared radiation thermometer.

Figure 5:
FIG. 5 shows two schematic temperature distribution views, one illustrating a temperature distribution at a surface of an electrode cover of a high frequency power introduction means as a result obtained in Experiment 1 which will be later described, the other illustrating a temperature distribution at a surface of an electrode cover of a high frequency power introduction means as a result obtained in Comparative Experiment 1 which will be later described.
Figure 5:

The measured result is shown in FIG. 5.

Comparative Example 1

In this comparative example, there was used a film-forming apparatus (a high frequency plasma CVD apparatus) shown in FIGS. 4(A) and 4(B), which is of the same constitution as the film-forming apparatus shown in FIGS. 2(A) and 2(B), except that the high frequency introduction means does not have such configuration as that in the film-forming apparatus shown in FIGS. 2(A) and 2(B).

Particularly, the high frequency power introduction means of the film-forming apparatus shown in FIGS. 4(A) and 4(B) comprises a solid high frequency electrode 401 (made of a SUS 306 stainless steel) of 18 mm in diameter which is enclosed in a pipe-like shaped electrode cover 402 (made of a ceramic material) of 26 mm in outer diameter and 20 mm in inner diameter.

In the same manner as in Experiment 1, only Ar gas instead of the film-forming raw material gas was introduced into the inner space (the discharge space) circumscribed by the cylindrical substrates though the gas feed pipes 206 to cause plasma discharge in the inner space.

After the plasma discharge was continued for 60 minutes, the temperature distribution of the surface of the electrode cover 402 was measured by means of the infrared radiation thermometer.

The measured result is shown in FIG. 5.

Based on the results shown in FIG. 5, the following facts are understood. The surface of the electrode cover in the film-forming apparatus shown in FIGS. 2(A) and 2(B) can be substantially entirely maintained at a desirably low temperature during the plasma discharge, although slight localization acurs in the temperature distribution of a nose portion of the surface of the electrode cover, which is opposite to the direction of the high frequency power applied, where the nose portion is locally heated to relatively high temperature.

On the other hand, in the case of the film-forming apparatus shown in FIGS. 2(A) and 2(B), a nose portion of the surface of the electrode cover, which is opposite to the direction of the high frequency power applied, is locally heated to higher temperature during the plasma discharge, where it is difficult for the surface of the electrode cover to be entirely maintained at a desirably low temperature in a uniform temperature distribution state.

Experiment 2

Figure 6:
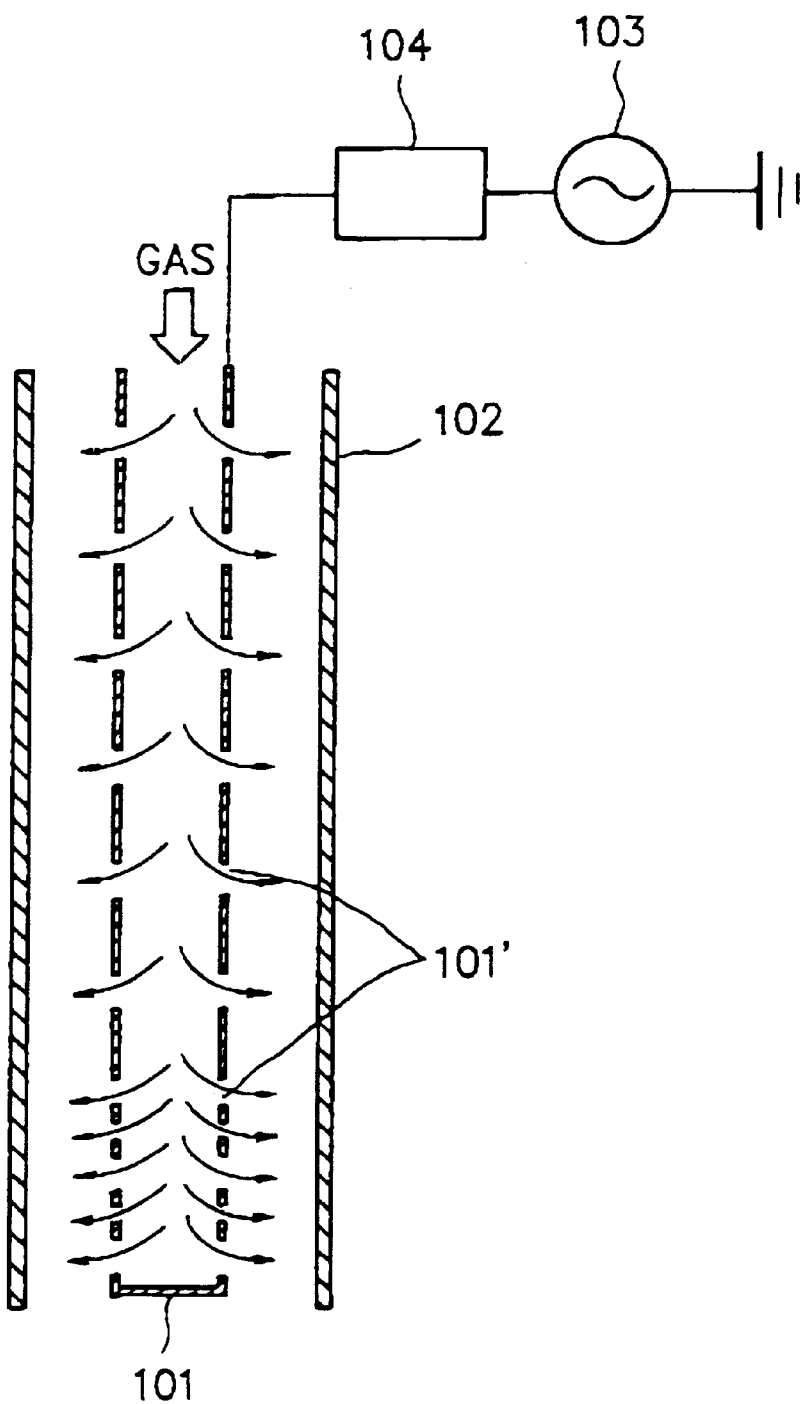

Taking particularly the results of Comparative Example 1 into consideration, the high frequency electrode 201 in the film-forming apparatus used in Experiment 1 was replaced by a hollow pipe-like shaped high frequency electrode (101) made of a SUS 306 stainless steel and which is provided with a plurality of gas ejection holes (101') such that their arrangement distribution is enhanced at a nose portion thereof which is opposite to the high frequency power introduction side thereof, as shown in FIG. 6.

Particularly, the hollow pipe-like shaped high frequency electrode is of 18 mm in outer diameter and 10 mm in inner diameter and has 4 longitudinal banks each comprising 15 circular gas ejection holes having a diameter of 1.5 mm, which are crosswise arranged at an equal interval, wherein said 15 gas ejection holes of each bank are arranged such that 10 of them spacedly lined in the nose portion (corresponding to $\frac{1}{3}$ of the length of the high frequency electrode) and the remaining 5 gas ejection holes are spacedly lined in the portion on the high frequency power introduction side (corresponding to $\frac{2}{3}$ of the length of the high frequency electrode).

Using the above film-forming apparatus, the procedures of Experiment 1 were repeated to cause plasma discharge in the inner space.

After the plasma discharge was continued for 60 minutes, the temperature distribution of the surface of the electrode cover was measured by means of the infrared radiation thermometer.

Figure 7:
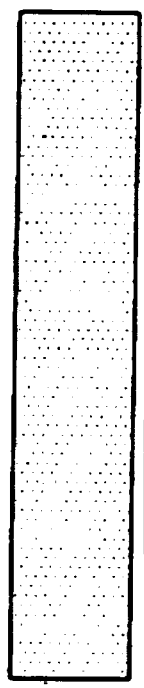
FIG. 7 shows a schematic temperature distribution view illustrating a temperature distribution at a surface of an electrode cover of a high frequency power introduction means as a result obtained in Experiment 2 which will be later described.
Figure 7:
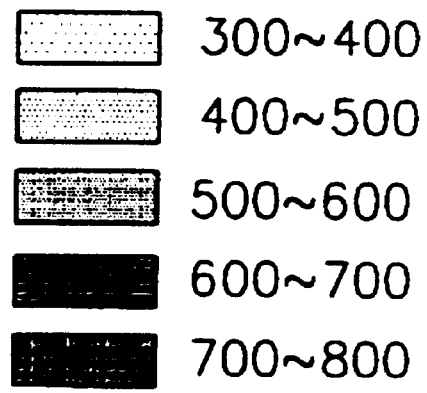

The measured result is shown in FIG. 7.

Based on the result shown in FIG. 7, the following facts are understood. By enhancing the arrangement distribution of the gas ejection holes in the nose portion (where the temperature rise is relatively high) of the high frequency electrode as above described, the surface of the electrode cover in the film-forming apparatus can be entirely maintained at a desirably low temperature in a uniform temperature distribution state during the plasma discharge.

EXPERIMENT 3 AND COMPARATIVE EXPERIMENT 2

Experiment 3

Using the same film-forming apparatus as used in Experiment 2 and in accordance with the foregoing procedures for the film formation using the film-forming apparatus shown in FIGS. 2(A) and 2(B), film formation was conducted under conditions shown in Table 2 and using $SiH_4$ gas as the film-forming raw material gas, where He gas was ejected against the inner face of the electrode cover through the gas ejection holes of the high frequency electrode in the manner described in Experiment 1. The film formation was conducted for a predetermined period of time.

For films deposited on the outer surface of the electrode cover during the film formation, examination was conducted to look for film peeling.

Figure 8:
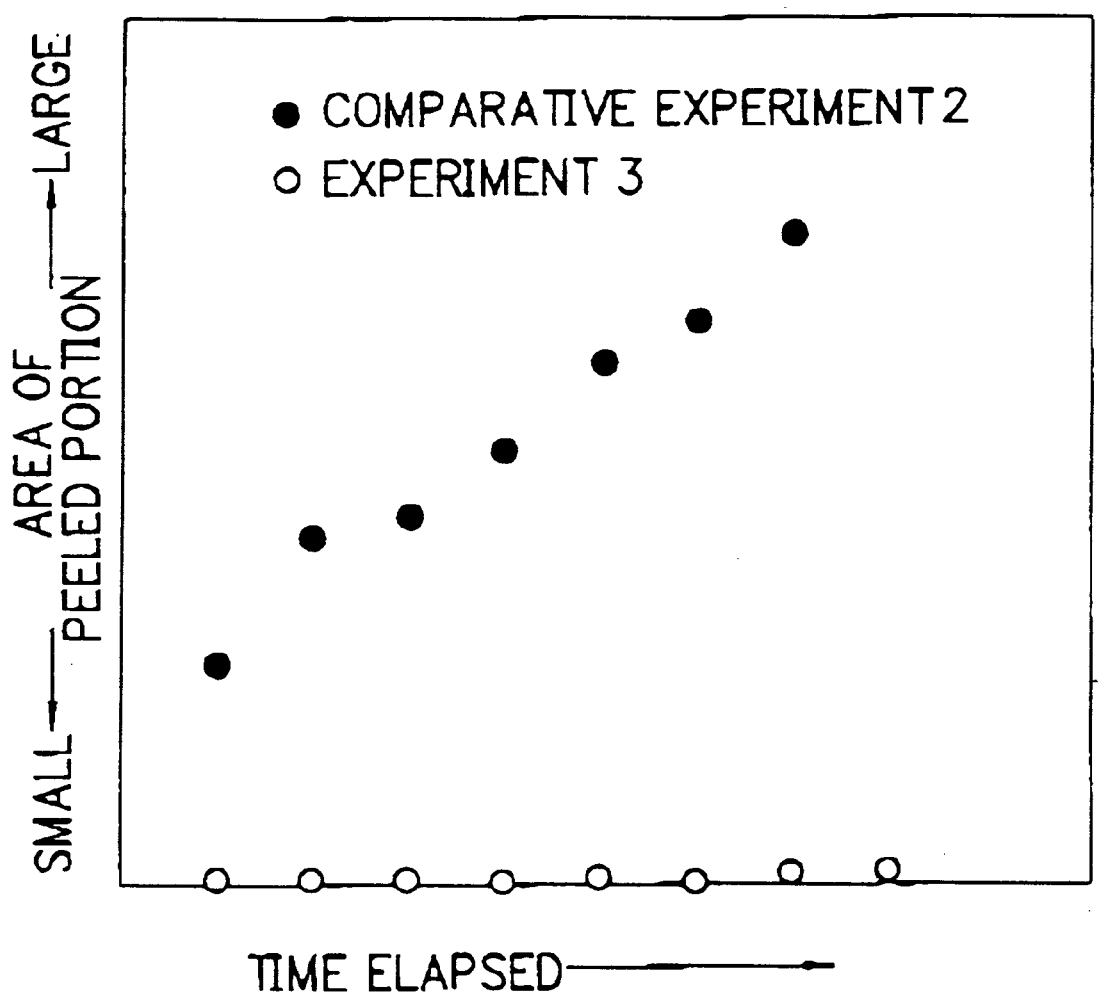
FIG. 8 shows a graph of results with respect to interrelations between areas of peeled portions and elapsed times, obtained in Experiment 3 and Comparative Experiment 3 which will be later described.

The results are graphically shown in FIG. 8.

Comparative Example 2

Using the same film-forming apparatus as used in Comparative Example 1, film formation was conducted under the conditions shown in Table 2 as well as Experiment 3.

For films deposited on the outer surface of the electrode cover during the film formation, examination was conducted with respect to film peeling.

The results are graphically shown in FIG. 8.

As the results shown in FIG. 8 illustrate, it is understood that in the case of the film-forming apparatus used in Experiment 3, films deposited on the outer surface of the electrode cover during the film formation are substantially maintained substantially without being peeled.

In the following, the features and advantages of the present invention will be described in more detail with reference to examples, which are only for illustrative purposes and not intended to restrict the scope of the present invention to these examples.

EXAMPLE 1

In this example, the film-forming apparatus shown in FIGS. 2(A) and 2(B) was used in which the high frequency electrode 201 (that is, the high frequency power introduction electrode) comprises a hollow pipe-like shaped high frequency electrode (made of a SUS 306 stainless steel) of 18 mm in outer diameter and 10 mm in inner diameter and having 4 longitudinal banks each comprising 10 circular gas ejection holes having a diameter of 1.5 mm (which are lined at an equal interval) and which are crosswise arranged at an equal interval, and the electrode cover 202 comprises a hollow pipe-like shaped electrode cover (made of an alumina ceramic material comprising $Al_2O_3$) of 26 mm in outer diameter and 20 mm in inner diameter. The hollow pipe-like shaped electrode cover has an outer surface [which is exposed to the inner space (the discharge space)] applied with blast processing to be an irregular surface having a Rz (ten points-average roughness based on a standard length of 2.5 mm) in the range of 30 to 100 $\mu$m.

Using this film forming apparatus and under conditions shown in Table 3, there were prepared a plurality of electrophotographic light receiving members having a three-layered light receiving layer (comprising a charge injection inhibition layer, a photoconductive layer and a surface layer stacked in the named order) of the configuration shown in FIG. 3 in the following manner.

Herein, each of the layer thicknesses shown in Table 3 is an approximate guide.

Six cylindrical substrates 205 (made of aluminum) of 358 mm in length, 108 mm in outer diameter and 5 mm in thickness and having a well-cleaned mirror-finished surface were positioned on the substrate holders 212 in the reaction chamber 200 as shown in FIGS. 2(A) and 2(B).

The inside of the reaction chamber 200 was evacuated to a predetermined vacuum degree through the exhaust pipe 207 by actuating the exhaust device (not shown).

By actuating the heaters 208, the cylindrical substrates 205 were heated to and maintained at 300° C. Thereafter, $SiH_4$ gas, $H_2$ gas, and $B_2H_6$ gas from the raw material gas supply system (not shown) were introduced into the inner space circumscribed by the cylindrical substrates 205 through the gas feed pipes 206 at respective flow rates of 500 sccm, 200 sccm and 1000 ppm (against the $SiH_4$ gas).

After the flow rate of each film-forming raw material gas became constant at said flow rate, the exhaust valve (not shown) of the exhaust pipe 207 was controlled to adjust the inner pressure (the gas pressure) in the reaction chamber 200 to 30 mTorr. He gas from the gas supply system (not shown) for the high frequency electrode 201 was introduced into the high frequency electrode at a flow rate of 1000 sccm, followed by ejecting against the inner face of the electrode cover 202 through the gas ejection holes of the high frequency electrode 201.

After the inner pressure (the gas pressure) in the reaction chamber 200 became constant at said pressure degree of 30 mTorr, the high frequency power source 203 was switched on to apply a high frequency power (of 5000 W) with an oscillation frequency of 105 MHz to the high frequency electrode 201 through the matching box 204. Plasma discharge occurred in the film-forming raw material gases introduced into the inner space to decompose the film-forming raw material gases to cause the formation of an about 5 $\mu$m thick amorphous silicon deposited film as the charge injection inhibition layer on each of the cylindrical substrates 205. In this case, the film formation was conducted without rotating the cylindrical substrates 205. The film-forming conditions herein are shown in Table 3.

After the formation of the charge injection inhibition layer on each of the cylindrical substrates 205, the application of the high frequency power to the high frequency electrode were terminated, the introduction of the film-forming raw material gases was terminated, and the introduction of the He gas into the high frequency electrode was terminated.

The above procedures for the formation of the charge injection inhibition layer were repeated, except that the film-forming conditions were changed to those shown in the column "photoconductive layer" of Table 3, to form an about 30 $\mu$m thick amorphous silicon deposited film as the photoconductive layer on the charge injection inhibition layer previously formed on each of the cylindrical substrates 205.

Then, the above procedures for the formation of the charge injection inhibition layer were repeated, except that the film-forming conditions were changed to those shown in the column "surface layer" of Table 3, to form an about 0.5 μm thick amorphous silicon deposited film as the surface layer on the photoconductive layer previously formed on each of the cylindrical substrates 205.

Thus, there were obtained six electrophotographic light receiving members having a three-layered light receiving layer (comprising a charge injection inhibition layer, a photoconductive layer and a surface layer stacked in the named order) of the configuration shown in FIG. 3.

Evaluation

For each of the six electrophotographic light receiving members (the electrophotographic light receiving member will be hereinafter referred to as "light receiving member") obtained in the above, evaluation was conducted with respect to appearance of defective image, using a modification of a commercially available electrophotographic apparatus NP 6060 (product of CANON Kabushiki Kaisha), modified for experimental purposes.

The above item was evaluated in the following manner.

Each of the six light receiving members is set in to the above electrophotographic apparatus, wherein an original comprising a halftone test chart FY9-9042 (produced by CANON Kabushiki Kaisha) in which the entire area comprises a halftone image is positioned on the original table of the electrophotographic apparatus, and the halftone test chart is subjected to reproduction to obtain a copied image. Of the copied images obtained using the six light receiving members, one which is worst in terms of the quality is examined as follows. The number of white spots having a diameter of 0.5 mm or less present in the copied image is examined.

The examined result is shown in Table 4 based on the following criteria.

⊚: a case wherein the number of the white spots is 0 to 2, which can be absolutely disregarded, ○: a case wherein the number of the white spots is 3 to 5, which can be disregarded, Δ: a case wherein the number of the white spots is 6 to 10, which is acceptable in practice, and X: a case wherein the number of the white spots is more than 11, which is practically unacceptable.

Comparative Example 1

In this comparative example, there was used the film-forming apparatus shown in FIGS. 4(A) and 4(B) [which is the same film-forming apparatus as used in Comparative Example 1], in which the high frequency power introduction means comprises a solid high frequency electrode 401 (made of a SUS 306 stainless steel) of 18 mm in diameter which is enclosed in a pipe-like shaped electrode cover 402 (made of an alumina ceramic material comprising $Al_2O_3$) ) of 26 mm in outer diameter and 20 mm in inner diameter.

Using the above film-forming apparatus and under the conditions shown in Table 3, there were prepared a plurality of electrophotographic light receiving members having a three-layered light receiving layer (comprising a charge injection inhibition layer, a photoconductive layer and a surface layer stacked in the named order) of the configuration shown in FIG. 3 in the following manner.

Six cylindrical substrates 205 made of aluminum of 358 mm in length, 108 mm in outer diameter and 5 mm in thickness and having a well-cleaned mirror-finished surface were positioned on the substrate holders 212 in the reaction chamber 200.

The inside of the reaction chamber 200 was evacuated to a predetermined vacuum degree through the exhaust pipe 207 by actuating the exhaust device (not shown).

By actuating the heaters 208, the cylindrical substrates 205 were heated to and maintained at 300° C. Thereafter, $SiH_4$ gas, $H_2$ gas, and $B_2H_6$ gas from the raw material gas supply system (not shown) were introduced into the inner space circumscribed by the cylindrical substrates 205 through the gas feed pipes 206 at respective flow rates of 500 sccm, 200 sccm and 1000 ppm (against the $SiH_4$ gas). After the flow rate of each film-forming raw material gas became constant at said flow rate, the exhaust valve (not shown) of the exhaust pipe 207 was controlled to adjust the inner pressure (the gas pressure) in the reaction chamber 200 to 30 mTorr.

After the inner pressure (the gas pressure) in the reaction chamber 200 became constant at said pressure degree, the high frequency power source 203 was switched on to apply a high frequency power (of 5000 W) with an oscillation frequency of 105 MHz to the high frequency electrode 401 through the matching box 204. Palasma discharge occurred in the film-forming raw material gases introduced into the inner space to decompose the film-forming raw material gases thereby causing the formation of a 5 μm thick amorphous silicon deposited film as the charge injection inhibition layer on each of the cylindrical substrates 205. In this case, the film formation was conducted while rotating the cylindrical substrates 205.

After the formation of the charge injection inhibition layer on each of the cylindrical substrates 205, the application of the high frequency power to the high frequency electrode, and the introduction of the film-forming raw material gases were terminated.

The above procedures for the formation of the charge injection inhibition layer were repeated, except that the film-forming conditions were changed to those shown in the column "photoconductive layer" of Table 3, to form a 30 μm thick amorphous silicon deposited film as the photoconductive layer on the charge injection inhibition layer previously formed each of the cylindrical substrates 205.

Then, the above procedures for the formation of the charge injection inhibition layer were repeated, except that the film-forming conditions were changed to those shown in the column "surface layer" of Table 3, to form a 0.5 μm thick amorphous silicon deposited film as the surface layer on the photoconductive layer previously formed each of the cylindrical substrates 205.

Thus, there were obtained six electrophotographic light receiving members having a three-layered light receiving layer (comprising a charge injection inhibition layer, a photoconductive layer and a surface layer stacked in the named order) of the configuration shown in FIG. 3.

For each of the six electrophotographic light receiving members obtained in the above, evaluation was conducted with respect to appearance of defective images in the same manner as in Example 1.

The evaluated result is shown in Table 4.

On the basis of the results shown in Table 4, it is understood that the batch comprising the six electrophotographic light receiving members obtained in Example 1 belonging to the present invention, which was prepared without rotating the cylindrical substrates, is surpassing the batch comprising the six electrophotographic light receiving members obtained in Comparative Example 1, which was prepared while rotating the cylindrical substrates, with respect to the evaluation item of appearance of defective image.

EXAMPLE 2

In this example, there was used a partial modification of the film-forming apparatus used in Example 1. That is, the high frequency power introduction means in the film-forming apparatus used in Experiment 1 was replaced by a high frequency power introduction means comprising a hollow pipe-like shaped high frequency electrode (made of a SUS 306 stainless steel) provided with a plurality of gas ejection holes such that their arrangement distribution is enhanced at a nose portion thereof which is opposite to the high frequency power introduction side thereof, as shown in FIG. 6, and a hollow pipe-like shaped electrode cover (made of an alumina ceramic material comprising $Al_2O_3$) of 26 mm in outer diameter and 20 mm in inner diameter. Particularly, the hollow pipe-like shaped high frequency electrode is of 18 mm in outer diameter and 10 mm in inner diameter and has 4 longitudinal banks each comprising 15 circular gas ejection holes having a diameter of 1.5 mm, which are crosswise arranged at an equal interval, wherein said 15 gas ejection holes of each bank are arranged such that 10 of them spacedly lined in the nose portion (corresponding to ⅓ of the length of the high frequency electrode) and the remaining 5 gas ejection holes are spacedly lined in the portion on the high frequency power introduction side (corresponding to ⅔ of the length of the high frequency electrode).

Except for using the above film-forming apparatus, the procedures of Example 1 were repeated to obtain six electrophotographic light receiving members having a three-layered light receiving layer (comprising a charge injection inhibition layer, a photoconductive layer and a surface layer stacked in the named order) of the configuration shown in FIG. 3.

Evaluation

For each of the six electrophotographic light receiving members (the electrophotographic light receiving member will be hereinafter referred to as "light receiving member") obtained in the above, evaluation was conducted with respect to (i) appearance of defective images and (ii) evenness in charge retentivity.

Evaluation of the Evaluation Item (i)

The evaluation with respect to appearance of defective images was conducted in the same manner as in Example 1. The evaluated result is shown in Table 5.

In Table 5, there is also shown the foregoing evaluated result with respect to appearance of defective images obtained in Example 1.

Evaluation of the Evaluation Item (ii)

The evaluation with respect to evenness in charge retentivity was conducted using the foregoing modification of the electrophotographic apparatus NP 6060 in the following manner.

Each of the six light receiving members is set into the above electrophotographic apparatus, wherein the light receiving member is charging so as to provide a predetermined surface potential, where a charge retentivity of the light receiving member is measured at selected surface portions of the light receiving member at an interval of 3 cm in the up-and-down direction. There are obtained a plurality of first mean values. For the values obtained, a first mean value is obtained. Of the values, one which is the most distant from the first mean value is made to be a charge retentivity of the light receiving member.

For all the six light receiving members, the above evaluation is conducted to obtain a charge retentivity for each of the six light receiving members. For the resultant six charge retentivities, there is obtained a second mean value. Of the six charge retentivities, for one which is the most distant from the second mean value, a proportion thereof to the second mean value is obtained.

The resultant proportion is made to an evenness in charge retentivity of the batch comprising the six light receiving members.

The result obtained is shown in Table 5 based on the following criteria.

⊚: a case wherein the proportion is less than 3%, which is excellent,

○: a case wherein the proportion is in the range of 3% to less than 5%, which is good enough, Δ: a case wherein the proportion is in the range of 5% to less than 10%, which is not so good but practically applicable, and X: a case wherein the proportion is more than 10%, which is relatively inferior and would be sometimes practically problematic.

Separately, the batch comprising the six light receiving members obtained in Example 1 was also evaluated with respect to evenness in charge retentivity in the above manner. The evaluated result is also shown in Table 5.

In addition, for comparison purposes, there is also shown the foregoing evaluated result with respect to appearance of defective images obtained in Comparative Example 1 in Table 5.

Further, the batch comprising the six light receiving members obtained in Comparative Example 1 was also evaluated with respect to evenness in charge retentivity in the above manner. The evaluated result is also shown in Table 5.

As the results shown in Table 5 illustrate, it is understood that all the two batches each comprising the six light receiving members obtained in Examples 1 and 2 belonging to the present invention surpass the batch comprising the six light receiving members obtained in Comparative Example 1 in terms of appearance of defective image and evenness in charge retentivity.

EXAMPLE 3

The procedures of Example 2 were repeated 5 times, except that the oscillation frequency of the high frequency power applied to the high frequency electrode 201 upon the formation of the light receiving layer was changed to 50 MHz, 80 MHz, 105 MHz, 200 MHz, or 450 MHz (see, Table 6) in each case, to obtain 5 batches each comprising six electrophotographic light receiving members having a three-layered light receiving layer (comprising a charge injection inhibition layer, a photoconductive layer and a surface layer stacked in the named order) of the configuration shown in FIG. 3.

For each of the 5 batches obtained, evaluation was conducted with respect to (i) appearance of defective image, and (ii) evenness in charge retentivity.

The evaluation of the evaluation item (i) was conducted in the same manner as in Example 1.

The evaluation of the evaluation item (ii) was conducted in the same manner as in Example 2.

The evaluated results are collectively shown in Table 6. The values shown in Table 6 are values relative to those obtained when the oscillation frequency was made 105 MHz, which are respectively set at 1.

The values shown in Table 6 are meant that the smaller the value is, the better the result is.

As the results shown in Table 6 illustrate, it is understood that when the oscillation frequency of the high frequency power applied to the high frequency electrode 201 upon the formation of the light receiving layer is made to be in the range of 50 MHz to 450 MHz, there can be efficiently obtained high quality electrophotographic light receiving members excelling in all the evaluation items.

EXAMPLE 4

The procedures of Example 2 were repeated, except that the He gas introduced into the high frequency electrode 201 was replaced by $H_2$ gas, to obtain six electrophotographic light receiving members having a three-layered light receiving layer (comprising a charge injection inhibition layer, a photoconductive layer and a surface layer stacked in the named order) of the configuration shown in FIG. 3.

Evaluation

For each of the six electrophotographic light receiving members (the electrophotographic light receiving member will be hereinafter referred to as "light receiving member") obtained in the above, evaluation was conducted with respect to (i) appearance of defective image, (ii) evenness in charge retentivity, and (iii) blank memory.

Evaluation of the Evaluation Item (i)

The evaluation with respect to appearance of defective image was conducted in the same manner as in Example 1. The evaluated result is shown in Table 7.

In Table 7, there is also shown the foregoing evaluated result with respect to appearance of defective image obtained in Example 2.

Evaluation of the Evaluation Item (ii)

The evaluation with respect to evenness in charge retentivity was conducted in the same manner as in Example 2. The evaluated result is shown in Table 7.

In Table 7, there is also shown the foregoing evaluated result with respect to evenness in charge retentivity obtained in Example 2.

Evaluation of the Evaluation Item (iii)

The evaluation with respect to blank memory (or appearance of ghost in other words) was conducted using the foregoing modification of the electrophotographic apparatus NP 6060 in the following manner.

Each of the six light receiving members is set into the above electrophotographic apparatus, wherein using an original comprising a halftone test chart FY9-9042 (produced by CANON Kabushiki Kaisha) and a plurality of black circles of 1.1 in reflection density and 5 mm in diameter being spacedly arranged at given positions of the surface of said test chart. The image-forming process is continuously repeated to obtain copied images. The copied image obtained at the initial stage and that obtained at the last stage are examined for whether or not they contain a ghost image based on the black circle of the original, wherein in the case where such ghost image appeared, the difference between the reflection density of the reproduced halftone image and that of the ghost image is examined. This evaluation is conducted for all of the six light receiving member. The one which is worst in terms of the appearance of ghost is dedicated for the evaluation on the following criteria:

⊚: a case wherein the copied image is excellent in quality,
○: a case wherein the copied image is good enough in quality,
Δ: a case wherein the copied image is not so good in quality but is practically acceptable, and
X: a case wherein the copied image is inferior in quality but is practically acceptable.

The evaluated result is shown in Table 7.

Separately, the batch comprising the six light receiving members obtained in Example 2 was also evaluated with respect to blank memory in the above manner. The evaluated result is also shown in Table 7.

As the results shown in Table 7 illustrate, it is understood that all the six light receiving members obtained in this example (that is, Example 4) are equally excellent in all the evaluation items (i) to (iii). Particularly, in comparison with Example 2 with respect to the evaluation item (iii), it is understood that by using $H_2$ gas as the gas ejected from the high frequency electrode 201, there can be obtained an electrophotographic light receiving member having an improved performance in terms of blank memory.

Now, as apparent from the above description, the present invention provides such advantages as will be described in the following.

The high frequency power introduction means according to the present invention which is used in the film formation by way of high frequency plasma CVD is designed such that it comprises at least a high frequency power introduction electrode and an insulating member for covering said electrode so as to isolate the surface of said electrode from glow discharge caused upon film formation, said electrode being provided with a plurality of gas ejection holes for ejecting gas against the inner face of the insulating member, wherein film formation is conducted while ejecting a given gas (such as inert gas or $H_2$ gas) against the inner face of the insulating member through the gas ejection holes of the electrode, where the outer surface of the insulating member, which is exposed to the glow discharge, is prevented from being heated to high temperature and a film deposited on the outer surface of the insulating member is desirably prevented from being peeled.

This permits efficient production of a high quality light receiving member (an electrophotographic light receiving member) excelling in electrophotographic characteristics at a high yield, even under high speed film-forming conditions.

For the gas ejection holes provided at the high frequency power introduction electrode, when their arrangement distribution is optimized, the temperature distribution at the outer surface of the insulating member is effectively prevented from being localized, where a high quality light receiving member excelling in electrophotographic characteristics and, particularly, which exhibits a desirably even charge retentivity can be efficiently produced at a high yield. For the reason for this, it is considered such that adverse effects to a deposited film formed (such as uneven temperature distribution, contamination of foreign matter, and the like) due to uneven temperature distribution (local temperature rise) in the insulating electrode cover, which are likely to occur in the case of the conventional high frequency power introduction means, are effectively prevented from occurring.

Further, in the present invention, when $H_2$ gas is used as the gas ejected from the inside of the high frequency power introduction electrode, a high quality light receiving member excelling in electrophotographic characteristics and, particularly, which is substantially free of the problem relating to blank memory can be efficiently produced at a high yield. The reason for this, is not clear at the present time. But it is considered that when the $H_2$ gas passes through the inside of the conductor with a high frequency power applied, or it passes through the pipe maintained at a certain temperature or above, the $H_2$ gas is activated and then leaks into the discharge space (where plasma is generated). This situation provides a certain positive effect in the formation of a deposited film.

TABLE 1

| high frequency power (W) | 5000 |
|---|---|
| oscillation frequency (MHz) | 105 |
| inner pressure (mTorr) | 100 |

TABLE 2

| high frequency power (W) | 4000 |
|---|---|
| oscillation frequency (MHz) | 105 |
| inner pressure (mTorr) | 150 |

TABLE 3

| | layer formed | | |
|---|---|---|---|
| conditions | charge injection inhibition layer | photoconductive layer | surface layer |
| raw material gas and its flow rate | | | |
| $SiH_4$ (sccm) | 500 | 400 | 200 |
| $H_2$ (sccm) | 200 | 1000 | 200 |
| $B_2H_6$ (ppm) (against $SiH_4$) | 1000 | 0.5 | |
| $CH_4$ (sccm) | | | 500 |
| substrate temperature (° C.) | 300 | 300 | 300 |
| inner pressure (mTorr) | 30 | 50 | 50 |
| high frequency power (105 MHz) (W) | 5000 | 5000 | 3000 |
| layer thickness ($\mu$m) | 5 | 30 | 0.5 |

TABLE 4

| | appearance of defective image |
|---|---|
| Example 1 | ⊚ |
| Comparative Example 1 | Δ |

TABLE 5

| | appearance of defective image | evenness in charge retentivity |
|---|---|---|
| Example 2 | ⊚ | ⊚ |
| Example 1 | ⊚ | ○ |
| Comparative Example 1 | Δ | Δ |

TABLE 6

| oscillation frequency (MHz) | 50 | 80 | 105 | 200 | 450 |
|---|---|---|---|---|---|
| appearance of defective image | 1.1 | 0.95 | 1 | 1 | 0.95 |
| evenness in charge retentivity | 0.98 | 1.03 | 1 | 0.98 | 1.02 |

Note: The smaller the value is, the better the result is.

TABLE 7

| | appearance in defective image | evenness in charge retentivity | blank memory |
|---|---|---|---|
| Example 4 | ⊚ | ⊚ | ⊚ |
| Example 2 | ⊚ | ⊚ | ○ |

What is claimed is:

1. A film-forming apparatus comprises a substantially enclosed reaction chamber, a substrate holding means for arranging a substrate for film formation in said reaction chamber, a raw material gas introduction means for introducing a film-forming raw material gas into said reaction chamber, and a high frequency power introduction means for introducing a high frequency power into said reaction chamber, wherein said high frequency power introduction means comprises at least an electrode for introducing said high frequency power into said reaction chamber and an insulating member which covers a surface of said electrode such that the surface of said electrode is isolated from glow discharge caused in said reaction chamber;

said electrode is provided with a plurality of gas election holes for ejecting a cooling gas against an inner face of said insulating member, said electrode having a hollow portion capable of serving as a passage for said cooling gas introduced therein, said hollow portion being communicated with said plurality of gas ejection holes; and said film-forming apparatus is provided with a gas introduction means for introducing said cooling gas into said hollow portion of said electrode.

2. A film-forming apparatus according to claim 1, wherein the insulating member comprises a ceramic material.

3. A film-forming apparatus according to claim 1, wherein the high frequency power introduction means is capable of providing a high frequency power with an oscillation frequency in the range of 50 MHz to 450 MHz.

4. A film-forming apparatus according to claim 1, wherein the gas ejection holes are provided at the electrode such that they are uniformly arranged.

5. A film-forming apparatus according to claim 1, wherein the gas ejection holes are provided at the electrode such that they are densely arranged in a direction of a nose portion of the electrode.

6. A film-forming apparatus according to claim 1, wherein the cooling gas introduced into the hollow portion of the electrode is inert gas.

7. A film-forming apparatus according to claim 1, wherein the cooling gas introduced into the hollow portion of the electrode is hydrogen gas.

8. A film-forming apparatus according to claim 1, wherein the substrate comprises a plurality of substrates, and said plurality of substrates are arranged on a common circumference such that they circumscribe the high frequency power introduction means.

9. A film-forming apparatus according to claim 8, wherein the high frequency power introduction means has a diameter corresponding to 4 to 25% of a diameter of a circle formed by the substrates arranged on the common circumference.

10. A film-forming apparatus according to claim 1, wherein the substrate has a cylindrical form.

11. A film-forming apparatus according to claim 1, wherein a clearance of 0.5 mm to 5 mm is present between the insulating member and the electrode.

12. A film-forming apparatus according to claim 1, wherein the insulating member has an irregular surface which is exposed to glow discharge caused in the reaction chamber, said irregular surface being of 5 μm to 200 μm in ten points-average roughness Rz based on a standard length of 2.5 mm.

13. A film-forming apparatus according to claim 1, wherein the insulating member has a thickness of 0.5 mm to 20 mm.

14. A film-forming apparatus according to claim 1, wherein the electrode has a hollow form.

15. A film-forming apparatus comprises a substantially enclosed reaction chamber, a substrate holding means for arranging a substrate for film formation in said reaction chamber, a raw material gas introduction means for introducing a film-forming raw material gas into said reaction chamber, and a high frequency power introduction means for introducing a high frequency power into said reaction chamber, wherein said high frequency power introduction means has a hollow portion;

said high frequency introduction means comprises an electrode having a plurality of gas ejection holes which are communicated with said hollow portion and an insulating material provided about said electrode to oppose said plurality of gas ejection holes so that said electrode is covered by said insulating material to have a clearance between said electrode and said insulating material; and said film-forming apparatus is provided with a gas introduction means for introducing a cooling gas into said hollow portion so as to pass through said plurality of gas ejection holes of said electrode into said clearance between said electrode and said insulating material.

16. A film-forming apparatus according to claim 15, wherein the insulating material comprises a ceramic material.

17. A film-forming apparatus according to claim 15, wherein the high frequency power introduction means is capable of providing a high frequency power with an oscillation frequency in a range of 50 MHz to 450 MHz.

18. A film-forming apparatus according to claim 15, wherein the gas ejection holes are provided at the electrode such that they are uniformly arranged.

19. A film-forming apparatus according to claim 15, wherein the gas ejection holes are provided at the electrode such that they are densely arranged in a direction of a nose portion of the electrode.

20. A film-forming apparatus according to claim 15, wherein the cooling gas introduced into the hollow portion of the high frequency power introduction means is inert gas.

21. A film-forming apparatus according to claim 15, wherein the cooling gas introduced into the hollow portion of the high frequency power introduction means is hydrogen gas.

22. A film-forming apparatus according to claim 15, wherein the substrate comprises a plurality of substrates, and said plurality of substrates are arranged on a common circumference such that they circumscribe the high frequency power introduction means.

23. A film-forming apparatus according to claim 22, wherein the high frequency power introduction means has a diameter corresponding to 4 to 25% of a diameter of a circle formed by said plurality of substrates arranged on said common circumference.

24. A film-forming apparatus according to claim 15, wherein the substrate has a cylindrical form.

25. A film-forming apparatus according to claim 15, wherein the clearance between the insulating material and the electrode has an interval of 0.5 mm to 5 mm.

26. A film-forming apparatus according to claim 15, wherein the insulating material has an irregular surface which is exposed to glow discharge caused in the reaction chamber, said irregular surface being of 5 μm to 200 μm in ten points-average roughness Rz based on a standard length of 2.5 mm.

27. A film-forming apparatus according to claim 15, wherein the insulating material has a thickness of 0.5 mm to 20 mm.

28. A film-forming apparatus according to claim 15, wherein the electrode has a hollow form.

* * * * *

UNITED STATES PATENT AND TRADEMARK OFFICE
CERTIFICATE OF CORRECTION

PATENT NO. : 6,135,053
DATED : October 24, 2000
INVENTOR(S) : Ryuji Okamura

It is certified that error appears in the above-identified patent and that said Letters Patent is hereby corrected as shown below:

Title page,
Item [30], Foreign Application Priority Data, insert -- July 16, 1998 [JP] Japan .....10-218585 --.

Sheet 5 of 8,
Figure 5, "RESVLTS" should read -- RESULTS -- (both occurrences).

Sheet 7 of 8,
Figure 7, "RESVLTS" should read -- RESULTS --.

Column 2,
Line 27, "detective" should read -- defective -- and "reproduced" should be deleted;
Line 30, "optional" should read -- optimal --;
Line 55, "to" should be deleted.

Column 4,
Line 22, "means" should be deleted.

Column 5,
Line 37, "member formation" should read -- member. The formation --.

Column 6,
Line 11, "and said" should be deleted.

Column 8,
Line 19, "can" should read -- can be --.

Column 9,
Line 24, "it" should be deleted.

Column 10,
Line 43, "is" should read -- which is --;
Line 23, "a" should read -- and a --.

Column 14,
Line 19, "conductivity" should read -- conductivity. --;
Line 20, "(these" should read -- (These --.

UNITED STATES PATENT AND TRADEMARK OFFICE
CERTIFICATE OF CORRECTION

PATENT NO. : 6,135,053
DATED : October 24, 2000
INVENTOR(S) : Ryuji Okamura

It is certified that error appears in the above-identified patent and that said Letters Patent is hereby corrected as shown below:

Column 17,
Line 8, "deteriorate" should read -- deteriorate, --.

Column 18,
Line 25, "order" should be deleted.

Column 20,
Line 25, "acurs" should read -- occurs --.

Column 21,
Lines 42 and 43, "substantially" should be deleted.

Column 24,
Line 30, "electrode," should read -- electrode --.

Signed and Sealed this

Twenty-fifth Day of December, 2001

Attest:

JAMES E. ROGAN
*Director of the United States Patent and Trademark Office*

*Attesting Officer*